(12) United States Patent
Tanaka

(10) Patent No.: US 11,219,128 B2
(45) Date of Patent: Jan. 4, 2022

(54) LAMINATED STRUCTURE

(71) Applicant: SHINKO ELECTRIC INDUSTRIES CO., LTD., Nagano (JP)

(72) Inventor: Izumi Tanaka, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 59 days.

(21) Appl. No.: 16/983,202

(22) Filed: Aug. 3, 2020

(65) Prior Publication Data
US 2021/0045242 A1  Feb. 11, 2021

(30) Foreign Application Priority Data
Aug. 8, 2019  (JP) .............................. JP2019-146311

(51) Int. Cl.
| | |
|---|---|
| H05K 1/11 | (2006.01) |
| H05K 1/02 | (2006.01) |
| H05K 1/16 | (2006.01) |
| H05K 1/18 | (2006.01) |

(52) U.S. Cl.
CPC .......... H05K 1/115 (2013.01); H05K 1/0298 (2013.01); H05K 1/16 (2013.01); H05K 1/182 (2013.01); H05K 1/185 (2013.01); H05K 1/18 (2013.01)

(58) Field of Classification Search
CPC ........ H05K 1/16; H05K 1/115; H05K 1/0298; H05K 2201/09036; H05K 2201/10416
See application file for complete search history.

(56) References Cited

U.S. PATENT DOCUMENTS

| | | | |
|---|---|---|---|
| 8,745,860 B2* | 6/2014 | Inui ...................... | H05K 3/4697 29/830 |
| 9,793,219 B2 | 10/2017 | Shimizu | |
| 2008/0007927 A1* | 1/2008 | Ito ..................... | H01L 23/49822 361/764 |
| 2011/0291293 A1* | 12/2011 | Tuominen ........... | H01L 23/5389 257/774 |
| 2015/0062850 A1* | 3/2015 | Choi .................... | H05K 3/4697 361/764 |
| 2016/0037620 A1* | 2/2016 | Kang .................... | H05K 1/0204 361/711 |

(Continued)

FOREIGN PATENT DOCUMENTS

JP  2016-149411  8/2016

*Primary Examiner* — Paresh H Paghadal
(74) *Attorney, Agent, or Firm* — IPUSA, PLLC

(57) ABSTRACT

A laminated structure includes an interconnect structure including first and second product areas and a first interconnect layer, and a first insulating layer formed on the interconnect structure. The first product area includes an opening penetrating the first insulating layer, and the second product area includes an annular groove penetrating the first insulating layer. The laminated structure further includes an electronic component mounted inside the opening in the first product area with an annular gap formed between the electronic component and a wall surface defining the opening, an insulating member located inside the groove in the second product area, a second insulating layer that fills the annular gap and the groove, and covers the first insulating layer, the electronic component, and the insulating member, and a second interconnect layer formed on the second insulating layer, and electrically connected to the first interconnect layer.

10 Claims, 19 Drawing Sheets

(56) References Cited

U.S. PATENT DOCUMENTS

| | | | |
|---|---|---|---|
| 2016/0192471 A1* | 6/2016 | Min | H05K 3/4602 |
| | | | 361/767 |
| 2016/0234929 A1* | 8/2016 | Lee | H05K 1/0271 |
| 2016/0240391 A1* | 8/2016 | Chen | H01L 23/3185 |
| 2016/0249445 A1* | 8/2016 | Min | H05K 1/181 |
| 2016/0302299 A1* | 10/2016 | Lee | H05K 1/181 |
| 2016/0338195 A1* | 11/2016 | Ikeda | H05K 1/115 |
| 2017/0135196 A1* | 5/2017 | Kim | H05K 1/0204 |
| 2018/0025956 A1* | 1/2018 | Cheng | H01L 23/49822 |
| | | | 174/252 |

\* cited by examiner

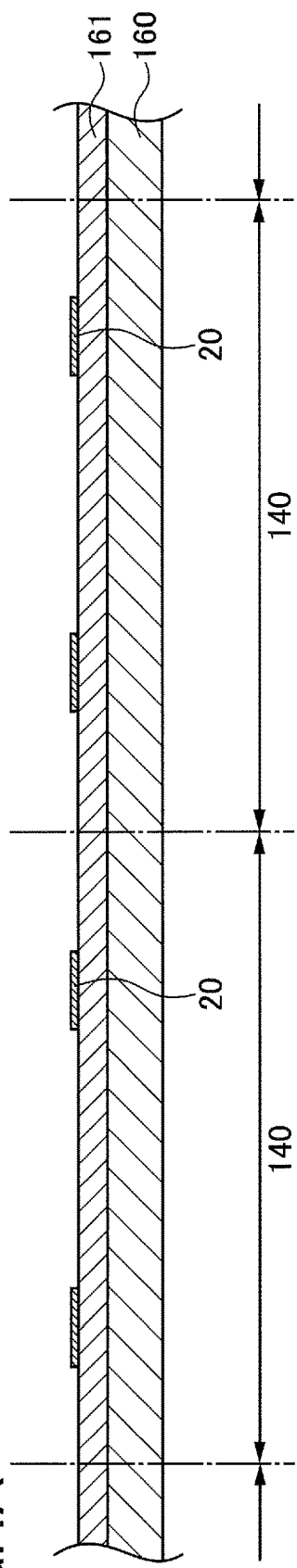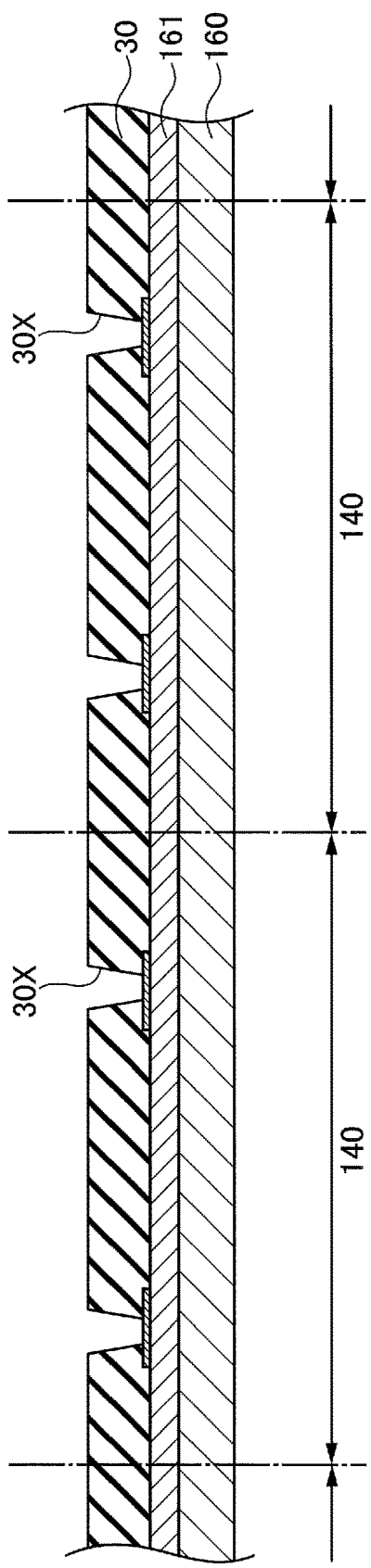

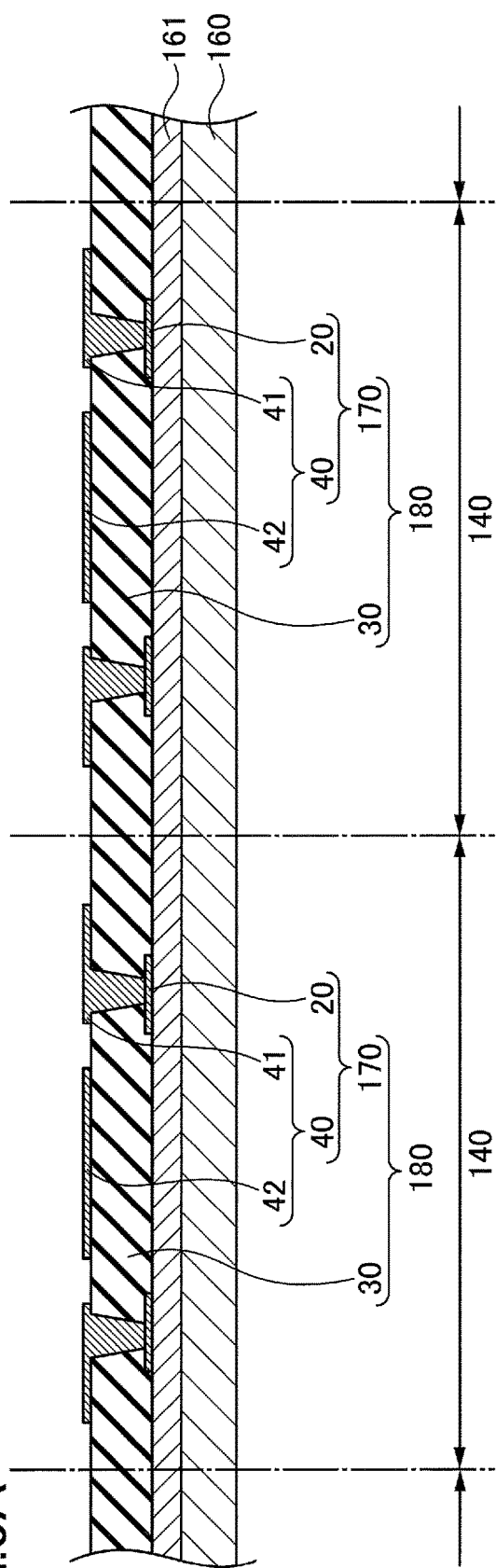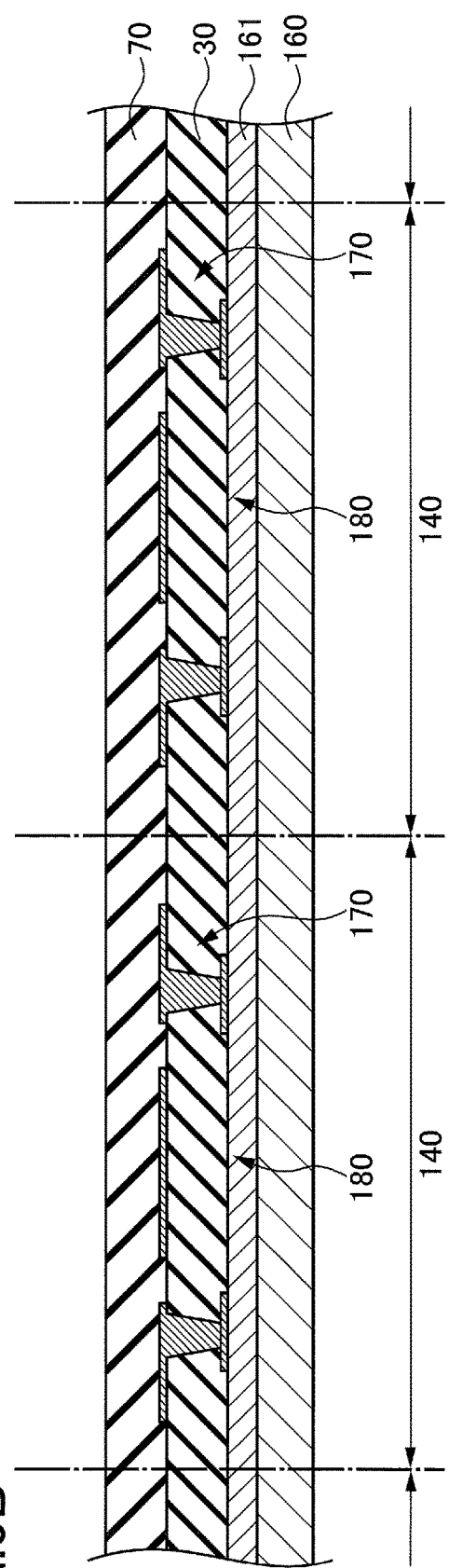

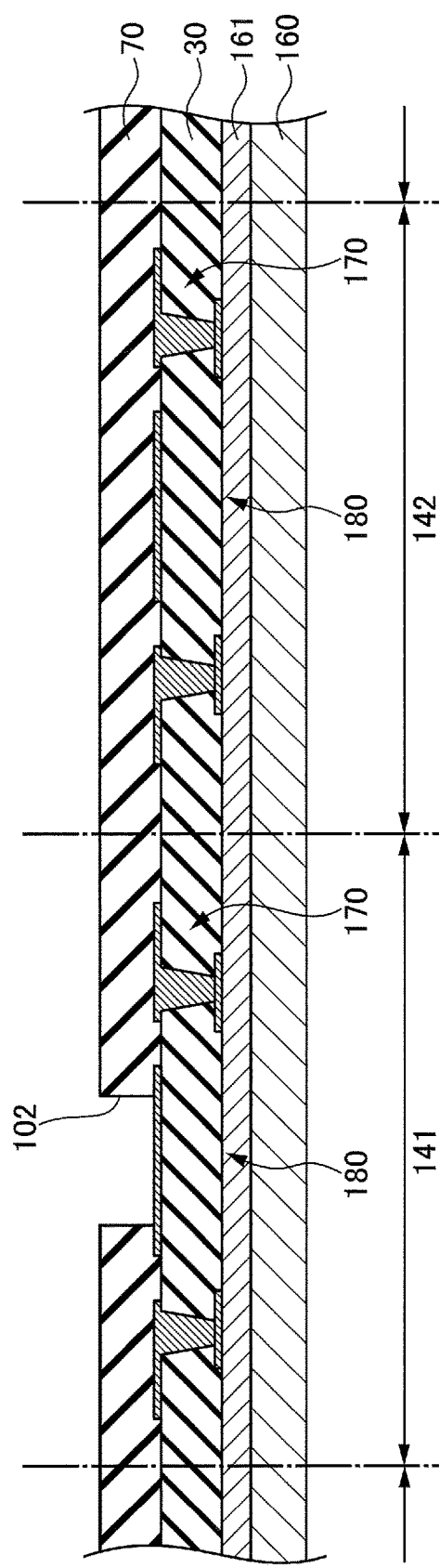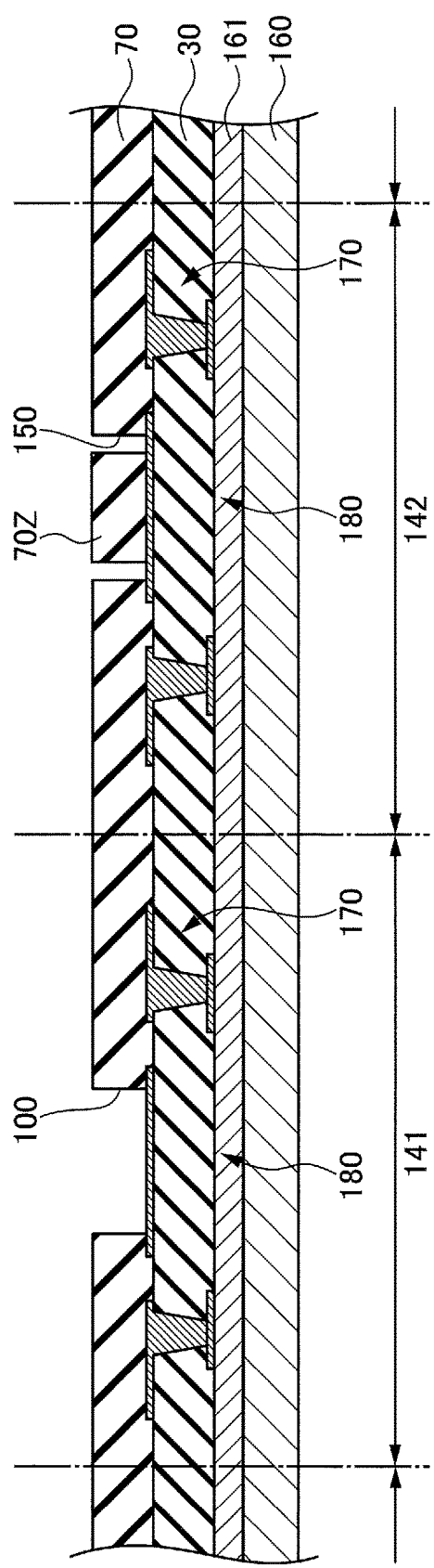

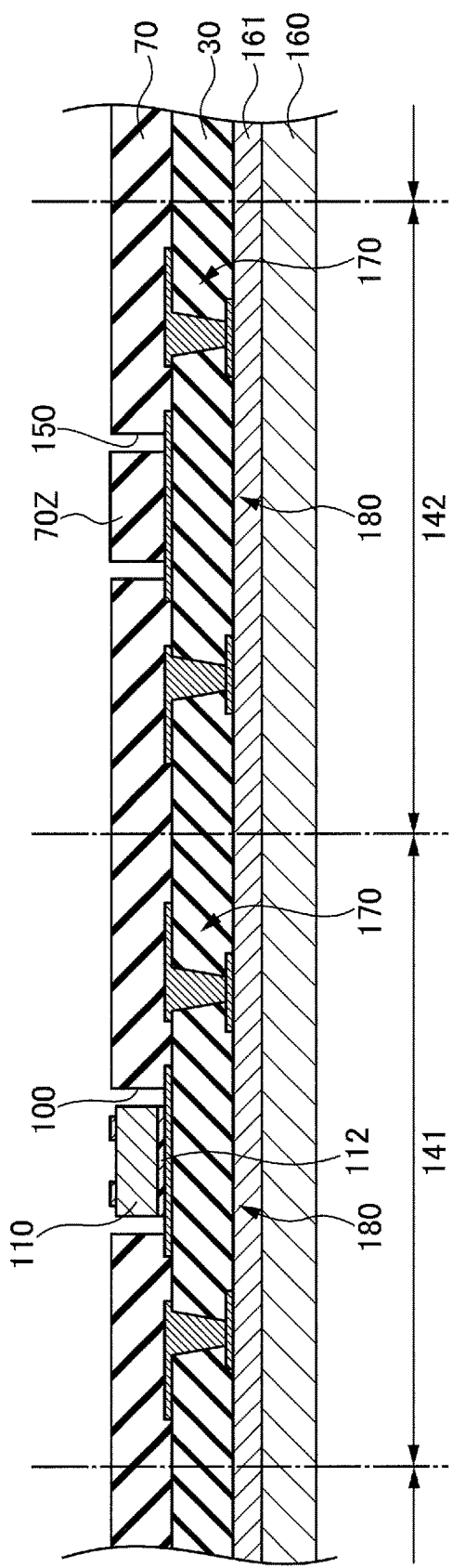
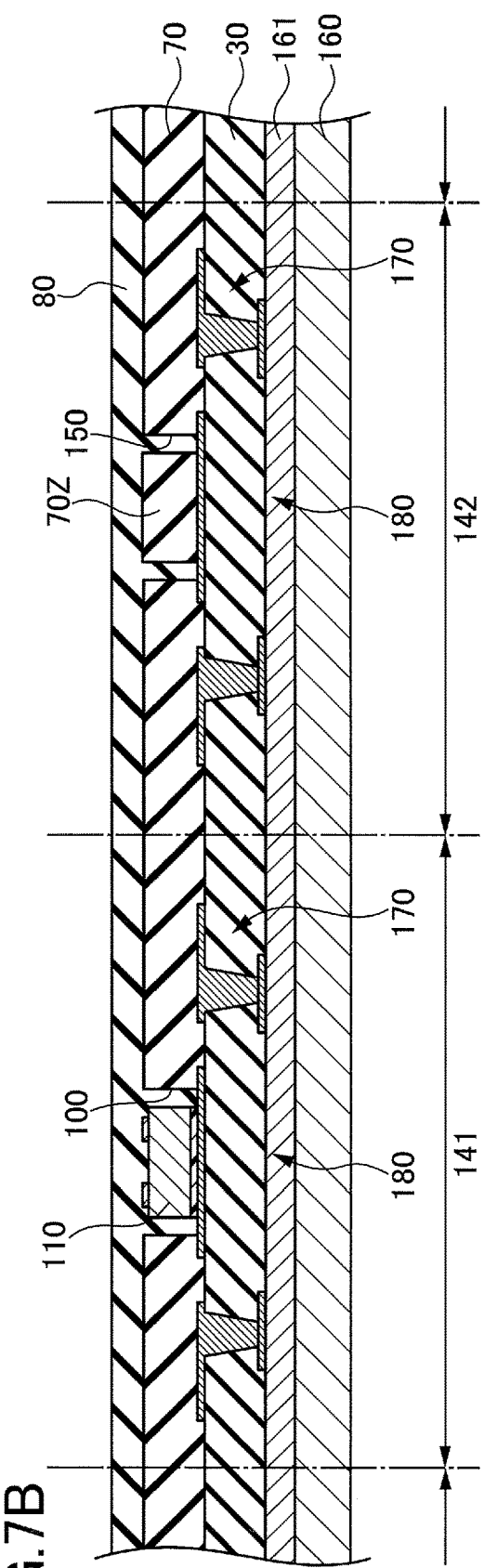
FIG.7A
FIG.7B

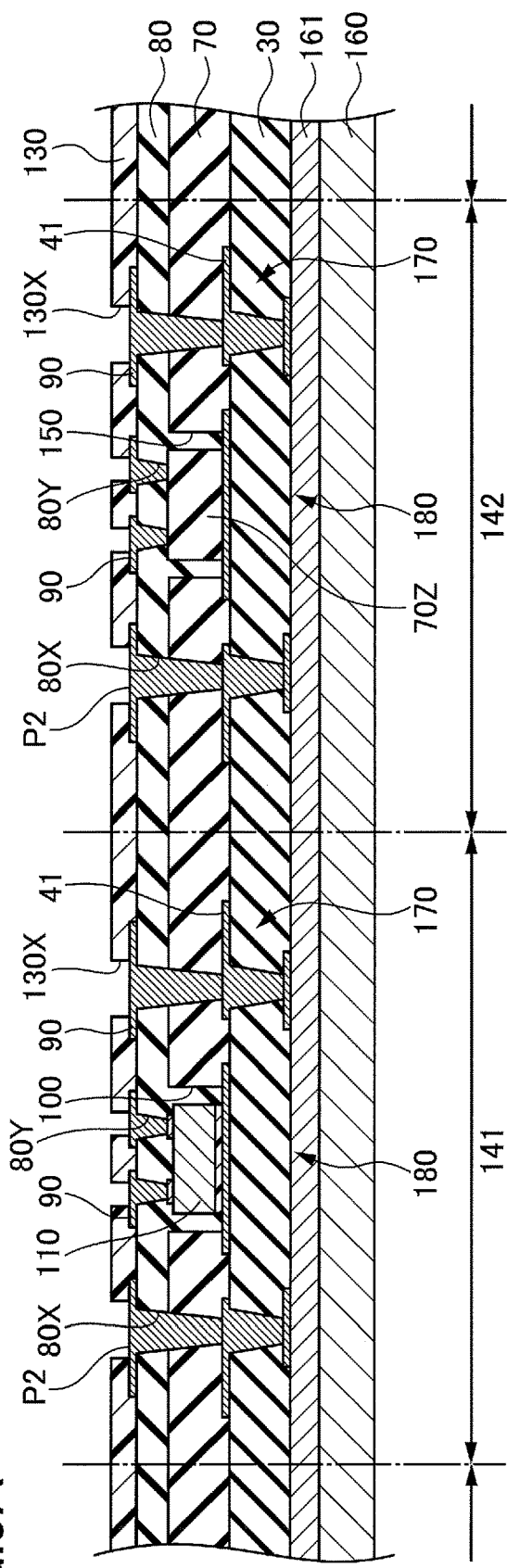

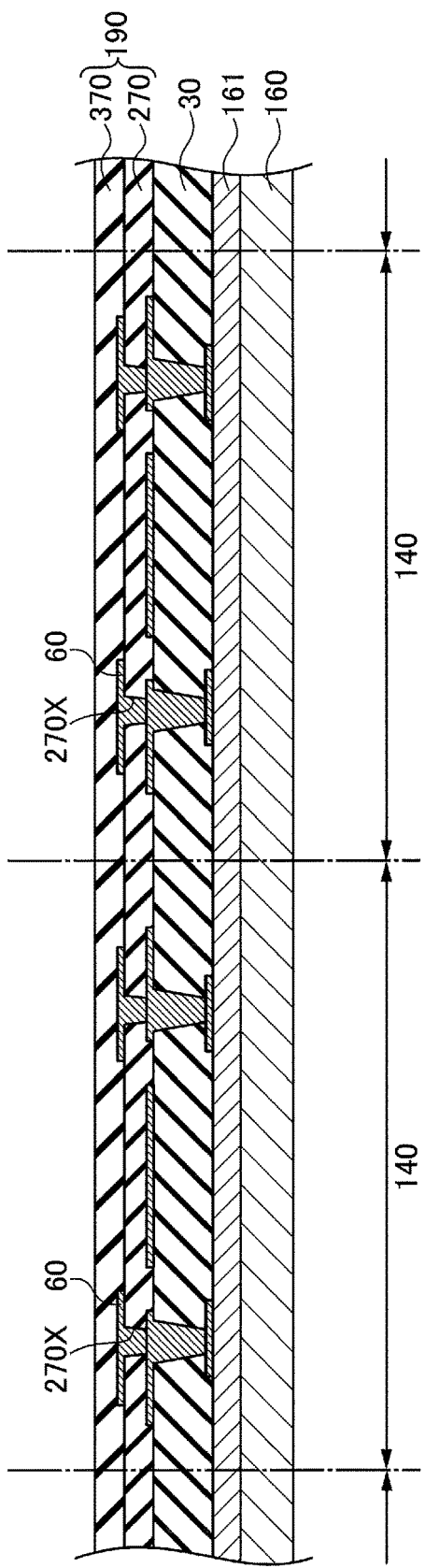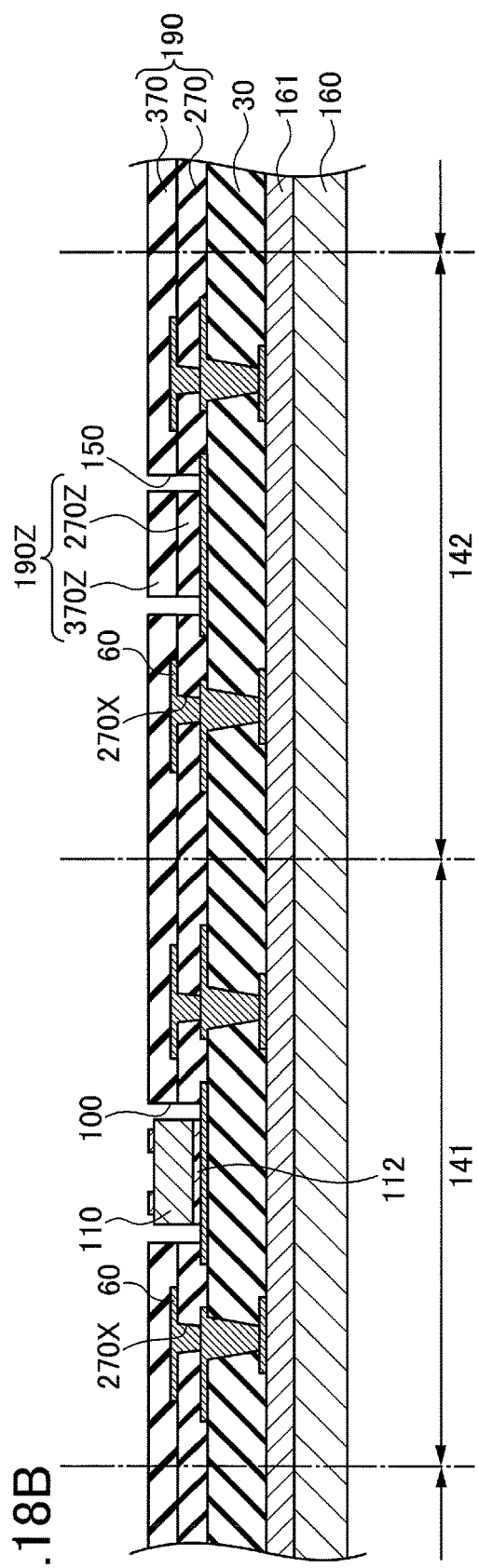

LAMINATED STRUCTURE

CROSS-REFERENCE TO RELATED APPLICATION

This application is based upon and claims priority to Japanese Patent Application No. 2019-146311, filed on Aug. 8, 2019, the entire contents of which are incorporated herein by reference.

FIELD

Certain aspects of the embodiments discussed herein are related to a laminated structure, and a method of manufacturing a wiring board.

BACKGROUND

Wiring boards having built-in electronic components, such as semiconductor chips, chip capacitors, or the like, are known from Japanese Laid-Open Patent Publication No. 2016-149411, for example. The electronic component is arranged inside an opening formed in an insulating layer of the wiring board.

The wiring boards having the built-in electronic components are manufactured using a large support base that includes a plurality of product areas. Conventionally, in each of the plurality of product areas, the opening is formed in the insulating layer and the electronic component is mounted inside the opening using an adhesive layer. A laminated structure including the electronic components is then cut into individual pieces respectively corresponding to the plurality of product areas.

Before the electronic components are mounted, characteristics of each of the plurality of product areas are inspected to determine whether or not the characteristics are satisfactory. After the laminated structure including the electronic components is cut into the individual pieces, the wiring board manufactured from the unsatisfactory product area is determined to be a defective wiring board, while the wiring board manufactured from the satisfactory product area is determined to be a non-defective (or good-quality) wiring board.

According to the method described above, even though the unsatisfactory product areas are determined before mounting the electronic components, the electronic components are also mounted within the unsatisfactory product areas that have been determined as being unsatisfactory. For this reason, the cost of electronic components and the adhesive layer is wasted, and wasted processes of forming the openings and mounting the electronic components are performed with respect to the unsatisfactory product areas. In other words, there is room to reduce the waste, so as to reduce the cost of the method described above.

SUMMARY

Accordingly, it is an object in one aspect of the embodiments to provide a laminated structure, and a method of manufacturing a wiring board, which can reduce costs.

According to one aspect of the embodiments, a laminated structure includes a first insulating layer that includes a first product area and a second product area; a first conductor layer and a first interconnect layer respectively formed on an upper surface of the first insulating layer in the first product area; a second conductor layer and a second interconnect layer formed on the upper surface of the first insulating layer in the second product area; a second insulating layer formed on the upper surface of the first insulating layer; an opening, included in the first product area, penetrating the second insulating layer along a thickness direction thereof, and exposing a portion of the first conductor layer; an annular groove, included in the second product area, penetrating the second insulating layer along the thickness direction thereof, and exposing a portion of the second conductor layer; an electronic component mounted inside the opening in the first product area with an annular gap between the electronic component and a wall surface defining the opening; an insulating member located inside the groove in the second product area; a third insulating layer that fills the annular gap and the groove, and covers the first insulating layer, the electronic component, and the insulating member; a third interconnect layer formed on an upper surface of the third insulating layer in the first product area, and electrically connected to each of the first interconnect layer and the electronic component; and a fourth interconnect layer formed on the upper surface of the third insulating layer in the second product area, and electrically connected to the second interconnect layer.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

BRIEF DESCRIPTION OF DRAWINGS

FIG. 4A and FIG. 4B are cross sectional views (part 1) illustrating the method of manufacturing the wiring board according to one embodiment.

FIG. 5A and FIG. 5B are cross sectional views (part 2) illustrating the method of manufacturing the wiring board according to one embodiment.

FIG. 6A and FIG. 6B are cross sectional views (part 3) illustrating the method of manufacturing the wiring board according to one embodiment.

FIG. 7A and FIG. 7B are cross sectional views (part 4) illustrating the method of manufacturing the wiring board according to one embodiment.

FIG. 9A and FIG. 9B are cross sectional views (part 6) illustrating the method of manufacturing the wiring board according to one embodiment.

FIG. 18A and FIG. 18B are cross sectional views (part 2) illustrating the method of manufacturing the wiring board according to the modification of the embodiment.

DESCRIPTION OF EMBODIMENTS

Figure 1:
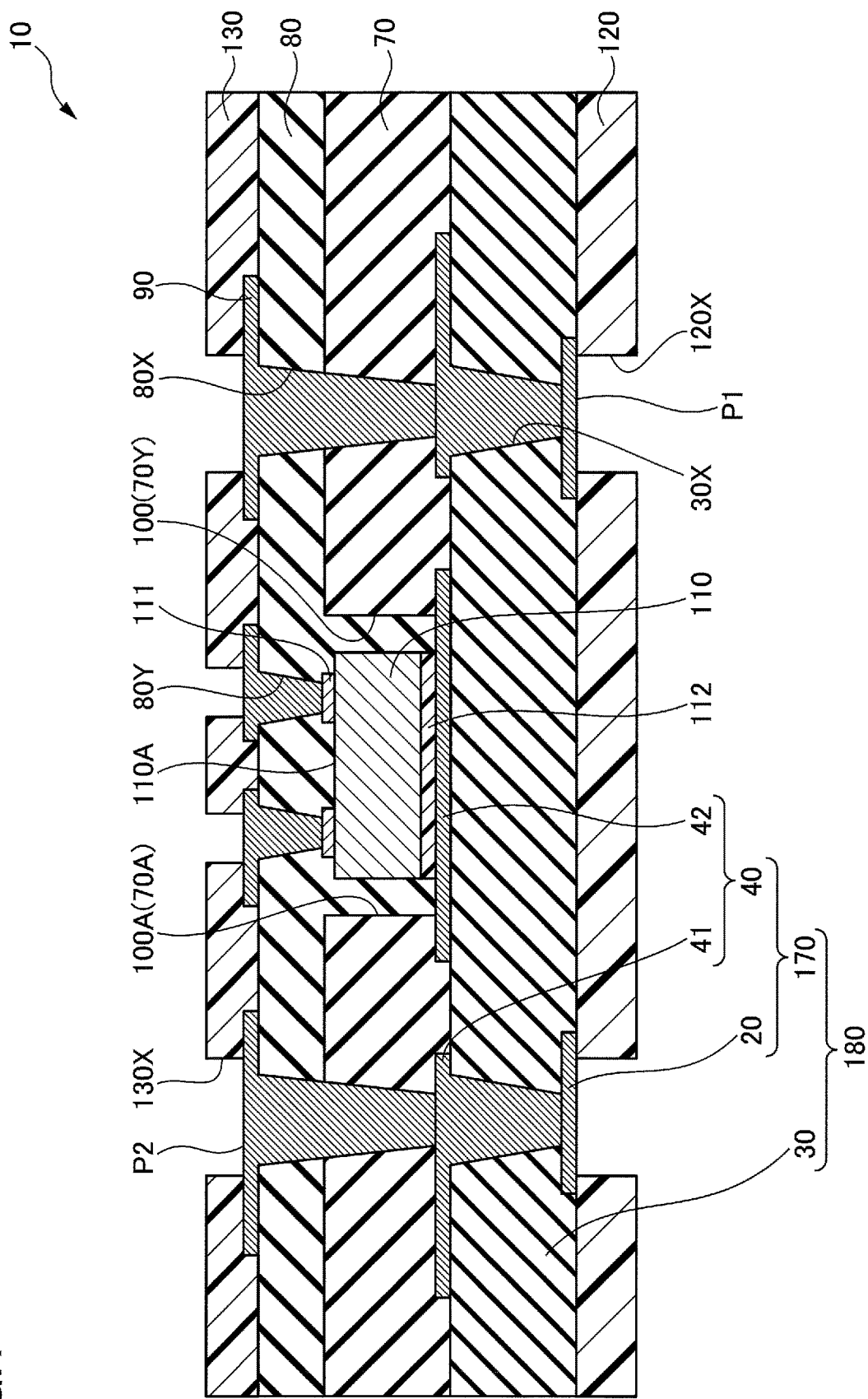
FIG. 1 is a cross sectional view illustrating a structure of a wiring board manufactured according to one embodiment.

In the conventional method of manufacturing the wiring board described above, the cost can be reduced by simply omitting the formation of the openings and the mounting of the electronic components in the unsatisfactory product areas having the unsatisfactory characteristics. However, simply omitting the formation of the openings and the mounting of the electronic components raise new problems described below.

After mounting the electronic components, the insulating layer having flow properties is formed to fill the openings and to cover the electronic components, or the like, and an interconnect layer that connects to the electronic components and an underlying interconnect layer is formed on an upper surface of the insulating layer. When the formation of the openings and the mounting of the electronic components are simply omitted, the shape of an underlayer of the insulating layer (including the openings and the electronic components) will greatly differ between the satisfactory product area having the satisfactory characteristics and the unsatisfactory product area having the unsatisfactory characteristics. For this reason, the thickness of the insulating layer easily becomes different between the satisfactory product area having the satisfactory characteristics and the unsatisfactory product area having the unsatisfactory characteristics, and the thickness of the insulating layer easily varies even among the satisfactory product areas having the satisfactory characteristics. The variation in the thickness of the insulating layer causes a variation in the depth of via holes that are formed to make electrical connections between the interconnect layer on the insulating layer and the electronic components or the underlying interconnect layer, and the variation in the depth of the via holes causes the connection reliability to deteriorate.

Accordingly, simply omitting the formation of the openings and the mounting of the electronic components will deteriorate the connection reliability.

By using dummy electronic components, that have substantially the same shape as the electronic components and use inexpensive materials, in place of the electronic components to be mounted within the unsatisfactory product areas, it is possible to reduce the cost of the wasted electronic components otherwise mounted within the unsatisfactory product areas while avoiding the deterioration of the connection reliability. However, even when the dummy electronic components are used, the cost of the adhesive layer is wasted, and the wasted processes of forming the openings and mounting the dummy electronic components are still performed with respect to the unsatisfactory product areas.

Based on the findings described above, and intensive studies to further reduce the cost while avoiding the deterioration of the connection reliability, the present inventor conceived the embodiments and modifications of the present disclosure as described below.

Embodiment

Preferred embodiments will be described with reference to the accompanying drawings. In the specification and the drawings, those constituent elements that are the same are designated by the same reference numerals, and a repeated description of the same constituent elements may be omitted. In addition, for the sake of convenience, the drawings may illustrate some features on an enlarged scale so as to facilitate the understanding of the features, and each of the constituent elements is not necessarily drawn to scale. Further, the scale may differ among the constituent elements, and may also differ from the actual dimensional proportions of the constituent elements. In the cross sectional view, the hatching illustrated for some members is replaced by a dot pattern in order to facilitate the understanding of the cross sectional structure of the members. In this specification, a "plan view" refers to a view of an object from a vertical direction (that is, up-and-down direction in the figure) in FIG. 1 or the like, and a "planar shape" refers to a shape of the object viewed from the vertical direction in FIG. 1 or the like. The vertical direction is approximately perpendicular to an upper surface of a wiring board 10 illustrated in FIG. 1, for example.

Structure of Wiring Board

First, a structure of a wiring board manufactured according to one embodiment of the present disclosure will be described. FIG. 1 is a cross sectional view illustrating the structure of the wiring board.

As illustrated in FIG. 1, the wiring board 10 manufactured according to one embodiment has a structure including an interconnect layer 20, an insulating layer 30, a conductor layer 40, an insulating layer 70, an insulating layer 80, and an interconnect layer 90 that are successively laminated. The wiring board 10 in this example has the so-called "coreless board" structure that does not include a support base, unlike the wiring board manufactured according to the general build-up process which successively laminates a predetermined number of build-up layers on both sides or on one side of a core board which is used as the support base.

The wiring board 10 includes one or a plurality of (one in this example) electronic components 110 arranged inside openings 100 formed in the insulating layer 70, a solder resist layer 120 laminated on a lower surface of the insulating layer 30, and a solder resist layer 130 laminated on an upper surface of the insulating layer 80. The wiring board 10 is a wiring board having built-in electronic components 110. The planar shape of the opening 100 is a rectangular shape, for example. In this specification, the rectangular shape not only includes a rectangular shape having four corners strictly forming a 90 degree angle, respectively, but also includes shapes that may generally be regarded as being a rectangular in shape, such as a generally rectangular shape having four corners that are chamfered or rounded.

Copper (Cu) and copper alloys, for example, may be used as the material forming the interconnect layers 20 and 90, and the conductor layer 40. Insulating resins, such as epoxy resins, polyimide resins, or the like, and resin materials containing a filler such as silica, alumina, or the like in such insulating resins, for example, may be used as the material forming the insulating layers 30, 70, and 80. Further, an insulating resin including a reinforcing material, such as woven or non-woven fabric of glass, aramid, and Liquid Crystal Polymer (LCP) fibers impregnated with a thermosetting resin including an epoxy resin, a polyimide resin, or the like as a main component thereof, for example, may also be used as the material forming the insulating layers 30, 70, and 80. A non-photosensitive insulating resin including a main component having a thermosetting property, and an insulating resin including a photosensitive resin as a main component thereof, for example, may also be used as the material forming the insulating layers 30, 70, and 80.

The interconnect layer 20 is an outermost interconnect layer (lowermost interconnect layer in this example) of wiring board 10, for example. A lower surface of the interconnect layer 20 is exposed from the insulating layer 30. The lower surface of the interconnect layer 20 in this example is formed approximately on the same plane as a lower surface of the insulating layer 30. The lower surface of the interconnect layer 20 may be formed to cave in toward the conductor layer 40 from the lower surface of the insulating layer 30. The interconnect layer 20 may have a thickness on the order of approximately 10 µm to approximately 30 µm, for example.

The insulating layer 30 covers an upper surface and a side surface of the interconnect layer 20, and is formed to expose the lower surface of the interconnect layer 20. The insulating layer 30 includes a through hole 30X that penetrates the insulating layer 30 along a thickness direction thereof, formed at predetermined positions, to expose a portion of the upper surface of the interconnect layer 20. The through hole 30X is formed to a tapered shape so that an opening width (or opening diameter) becomes smaller from the upper side (on the side of the conductor layer 40) toward the lower side (on the side of the interconnect layer 20) in FIG. 1, for example. For example, the through hole 30X is formed to an inverted truncated cone shape so that the opening diameter at the lower open end is smaller than the opening diameter at the upper open end. A thickness from the upper surface of the interconnect layer 20 to an upper surface of the insulating layer 30 may be on the order of approximately 10 µm to approximately 35 µm, for example.

The conductor layer 40 is formed on the upper surface of insulating layer 30. The conductor layer 40 may have a thickness on the order of approximately 10 µm to approximately 30 µm, for example. The upper surface and the side surface of conductor layer 40 may be roughened surfaces, for example.

The conductor layer 40 includes an interconnect layer 41, and a metal layer 42, for example. The interconnect layer 41 and the metal layer 42 are formed apart from each other and electrically insulated from each other. The interconnect layer 41 and the metal layer 42 are formed on the same plane.

The interconnect layer 41 is electrically connected to the interconnect layer 20, through a via interconnect filling the through hole 30X, for example. The interconnect layer 41 is formed integrally with the via interconnect filling the through hole 30X, for example.

The metal layer 42 is formed in a mounting area where the electronic component 110 is mounted, for example. The metal layer 42 is formed at a position overlapping the electronic component 110 in the plan view, for example. The metal layer 42 is formed at a position overlapping the opening 100 in plan view, for example. The planar shape of the metal layer 42 is larger than the planar shape of the opening 100, for example. An outer peripheral edge of the metal layer 42 is formed to surround an edge defining the opening 100 from the outer side in the plan view, for example. The metal layer 42 is formed to a rectangular shape in the plan view, for example. The metal layer 42 in this example is an electrically isolated (or floating) metal layer that is not electrically connected to other interconnect layers or conductor layers. The metal layer 42 may be an interconnect pattern that provides an interconnect path or routing, a power supply interconnect, a ground interconnect, or the like, for example. In a case where the metal layer 42 is the interconnect pattern, the power supply interconnect, or the ground interconnect, the metal layer 42 is electrically connected to another interconnect layer or conductor layer through the via interconnect or the like, for example.

The interconnect layer 20 and the conductor layer 40 are included in an interconnect layer 170. The interconnect layer 170 is an example of a first interconnect layer. In addition, the interconnect layer 170 and the insulating layer 30 are included in an interconnect structure 180.

The insulating layer 70 is formed on an upper surface of the insulating layer 30, so as to cover the conductor layer 40. A thickness from the upper surface of the conductor layer 40 to the upper surface of the insulating layer 70 may be on the order of approximately 40 µm to approximately 100 µm, for example. The insulating layer 70 is an example of a first insulating layer.

The opening 100 is formed to penetrate the insulating layer 70 along a thickness direction thereof, for example. The opening 100 is formed to expose a portion of an upper surface of the metal layer 42, for example. The opening 100 is formed in correspondence with the electronic component 110 to be built-in to the wiring board 10.

Figure 2:
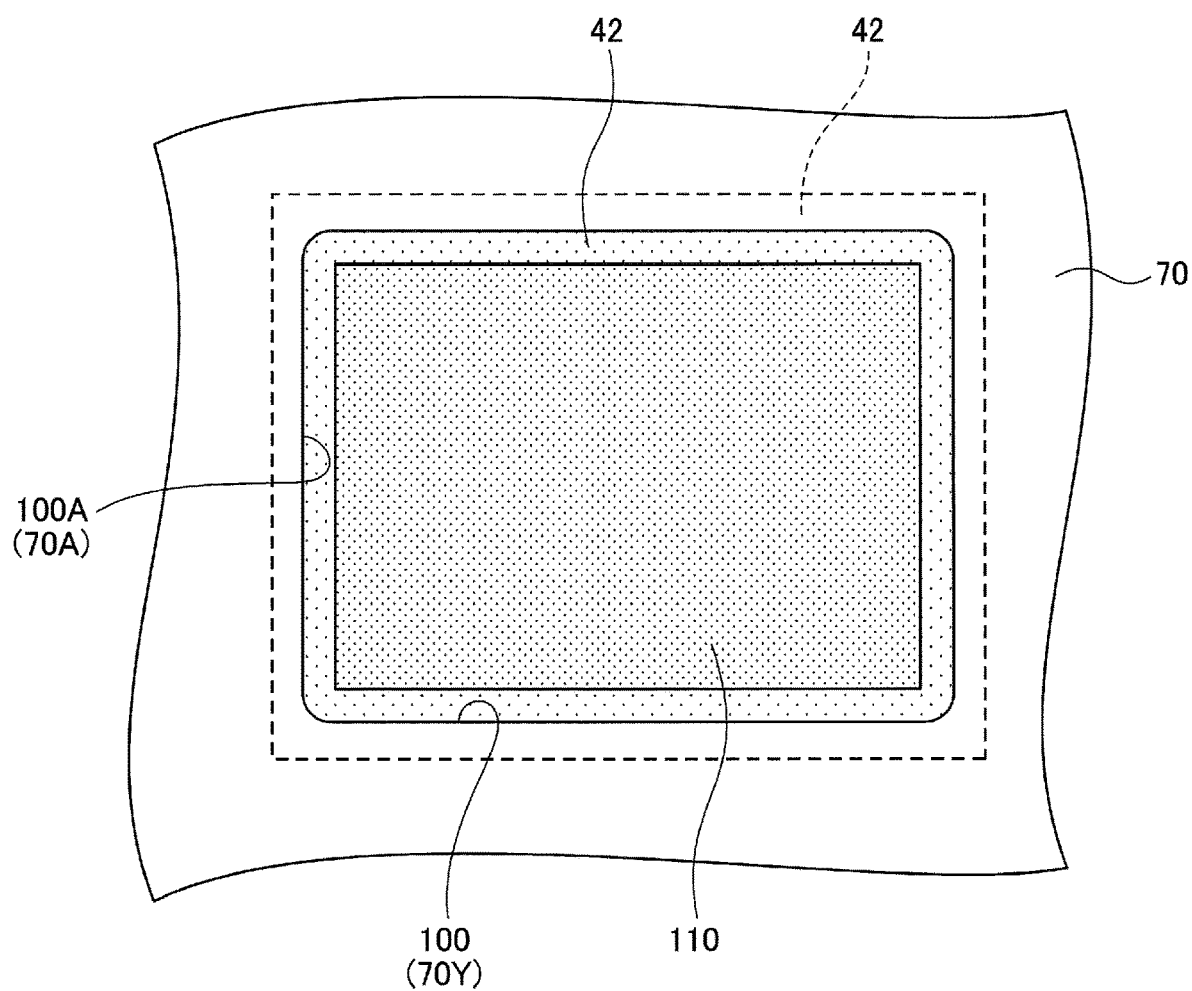
FIG. 2 is a plan view illustrating the structure of the wiring board manufactured according to one embodiment.

The opening 100 in this example is formed by a through hole 70Y that penetrates the insulating layer 70 along the thickness direction thereof. FIG. 2 is a plan view of the wiring board 10 illustrated in FIG. 1, viewed from above the wiring board 10. In FIG. 2, the insulating layer 80, the interconnect layer 90, and the solder resist layer 130 are respectively depicted in a perspective.

As illustrated in FIG. 2, the through hole 70Y in this example is formed to a rectangular shape in the plan view. The through hole 70Y is formed to have a planar shape larger than the planar shape of the electronic component 110. The through hole 70Y is formed to have a planar shape smaller than the planar shape of the metal layer 42, for example. The size of the through hole 70Y in the plan view may be on the order of approximately 0.7 mm×0.4 mm to approximately 15 mm×15 mm, for example.

A recess, that caves in toward the insulating layer 30, may be formed on the upper surface of the metal layer 42 that is exposed at a bottom of the opening 100 (more particularly, a bottom of the through hole 70Y). A bottom surface and an inner surface of the recess may be roughened surfaces, for example. A surface roughness of the bottom surface of the recess may be greater than a surface roughness of the upper surface of the metal layer 42 covered by the insulating layer 70, for example. In other words, the surface roughness of the upper surface of the metal layer 42 exposed at the bottom of the opening 100 may be greater than the surface roughness of the upper surface of the metal layer 42 covered by the insulating layer 70.

As illustrated in FIG. 1, the electronic component 110 is mounted (or bonded) on the upper surface of the metal layer 42 exposed from the opening 100, via an adhesive (or bonding) layer 112. That is, the electronic component 110 is arranged inside the opening 100. The adhesive layer 112 is formed on the upper surface of the metal layer 42. Thermosetting adhesives, such as epoxy-based adhesives, polyimide-based adhesives, silicone-based adhesives, or the like, for example, may be used as the material forming the adhesive layer 112.

The electronic component 110 may be an active component, such as a semiconductor chip, a transistor, a diode, or the like, or may be a passive component, such as a chip capacitor, a chip inductor, a chip resistor, or the like, for example. The electronic component 110 may be a silicon or a ceramic component (wiring substrate), for example. The electronic component 110 in this embodiment is a semiconductor chip. For example, a logic chip, such as a Central Processing Unit (CPU) chip, a Graphics Processing Unit (GPU) chip, or the like, may be used as the semiconductor chip. In addition, a memory chip, such as a Dynamic Random Access Memory (DRAM) chip, a Static Random Access Memory (SRAM) chip, a flash memory chip, or the like, for example, may also be used as the semiconductor chip.

The electronic component 110 includes a semiconductor substrate, for example. For example, silicon or the like may be used as the material forming the semiconductor substrate. The electronic component 110 is provided with a plurality of electrode terminals 111 on the circuit forming surface 110A where a semiconductor integrated circuit (not illustrated) is formed. The electrode terminal 111 is a columnar metal post extending upward from the circuit forming surface 110A, for example. Copper and copper alloys may be used as the material of the electrode terminal 111, for example.

The electronic component 110 is adhered to the upper surface of the metal layer 42 by the adhesive layer 112, in a state where a back surface (lower surface in this example) of the electronic component 110, opposite to the circuit forming surface 110A, opposes the upper surface of the metal layer 42, that is, in a face-up state of the electronic component. An upper surface of the electrode terminal 111 is formed on the same plane as the upper surface of the insulating layer 70, or on a plane below the upper surface of the insulating layer 70, for example.

The insulating layer 80 is formed to fill the opening 100, and to cover the entire electronic component 110. The insulating layer 80 is formed to cover the entire side surface of the adhesive layer 112, the entire side surface of the electronic component 110, the entire circuit forming surface 110A exposed from the electrode terminals 111, and the upper surface and the side surface of the electrode terminals 111, for example. The insulating layer 80 is formed inside the opening 100, so as to cover the surface of the metal layer 42 exposed from the adhesive layer 112, for example.

The insulating layer 80 is formed to cover the entire side surface 70A of the insulating layer 70, and the entire upper surface of the insulating layer 70, for example. A through hole 80X is formed at predetermined positions, of the insulating layers 70 and 80 to penetrate the insulating layers 70 and 80 along a thickness direction thereof, to expose a portion of the upper surface of the conductor layer 40 (interconnect layer 41 in this example). Further, a through hole 80Y is formed at a predetermined position of the insulating layer 80 to penetrate the insulating layer 80 along the thickness direction thereof, to expose a portion of the upper surface of the electrode terminal 111. The through holes 80X and 80Y are respectively formed to a tapered shape so that the opening width (or opening diameter) becomes smaller from the upper side (on the side of the interconnect layer 90) toward the lower side (on the side of the interconnect layer 41 or on the side of the electrode terminal 111) in FIG. 1, for example. For example, the through holes 80X and 80Y are respectively formed to an inverted truncated cone shape so that the opening diameter at the lower open end is smaller than the opening diameter at the upper open end. The side surface 70A of the insulating layer 70 also forms a wall surface 100A defining the opening 100.

The interconnect layer 90 is formed on the upper surface of the insulating layer 80. The interconnect layer 90 is an outermost interconnect layer (uppermost interconnect layer in this example) of the wiring board 10, for example. The interconnect layer 90 includes an interconnect layer that is electrically connected to the interconnect layer 41 through a via interconnect filling the through hole 80X. The interconnect layer 90 includes an interconnect layer that is electrically connected to the electrode terminal 111 through a via interconnect filling the through hole 80Y. The interconnect layer 90 is integrally formed with the via interconnect filling the through hole 80X or the through hole 80Y. The interconnect layer 90 may have a thickness on the order of approximately 10 μm to approximately 30 μm, for example. The interconnect layer 90 may include an interconnect layer that makes contact with an insulating member 70Z.

The solder resist layer 120 is formed on the lower surface of the outermost (lowermost in this example) insulating layer 30, so as to cover the lowermost interconnect layer 20. For example, insulating resins, such as epoxy resins, acrylic resins, or the like may be used as the material forming the solder resist layer 120. The solder resist layer 120 may have a thickness on the order of approximately 10 μm to approximately 30 μm, for example.

An opening 120X is formed in the solder resist layer 120 to expose at least a portion of the lower surface of the lowermost interconnect layer 20, as a pad P1. An external connection terminal, such as a solder ball, a lead pin, or the like used when mounting the wiring board 10 onto a mounting board such as a mother board, for example, is connected to the pad P1. In other words, the pad P1 in this example functions as an external connection pad.

A surface-treated layer may be formed on a lower surface of the pad P1, as appropriate. Examples of the surface-treated layer include a gold (Au) layer, a nickel (Ni) layer/Au layer (a metal layer including the Ni layer and the Au layer laminated in this order), a Ni layer/palladium (Pd) layer/Au layer (a metal layer including the Ni layer, the Pd layer, and the Au layer laminated in this order), or the like. The Au layer is a metal layer made of Au or Au alloy, the Ni layer is a metal layer made of Ni or Ni alloy, and the Pd layer is a metal layer made of Pd or Pd alloy. The Ni layer, the Au layer, and the Pd layer may be a metal layer (electroless-plated metal layer) formed by an electroless plating process. Other examples of the surface-treated layer include an Organic Solderability Preservative (OSP) film formed by an antioxidant process, such as an OSP process, performed on the surface of the pad P1. An organic coating of an azole compound, an imidazole compound, or the like may be used for the OSP film. The interconnect layer 20 (or the surface-treated layer when the surface-treated layer is formed on the interconnect layer 20) itself, exposed from the opening 120X, may be used as the external connection terminal.

The solder resist layer 130 is formed on the upper surface of the outermost (uppermost in this example) insulating layer 80, so as to cover the uppermost interconnect layer 90. Insulating resins, such as epoxy resins, acrylic resins, or the like may be used for the material forming the solder resist layer 130, for example. The solder resist layer 130 may have a thickness on the order of approximately 10 µm to approximately 30 µm, for example.

An opening 130X is formed in the solder resist layer 130 to expose at least a portion of the upper surface of the uppermost interconnect layer 90, as a pad P2. The pad P2 functions as a pad for mounting and electrically connecting an electronic component, such as a semiconductor chip or the like, on the wiring board 10.

A surface-treated layer may be formed on a surface (upper and side surfaces, or only the upper surface) of pad P2, as appropriate. Examples of the surface-treated layer include a metal layer, such as a Au layer, a Ni layer/Au layer, a Ni layer/Pd layer/Au layer, or the like, and an OSP film, for example.

In this embodiment, the wiring board 10 having the structure described above is manufactured.

It should be noted that the wiring board 10 may be used in an up-side down state, or at any angular arrangement.

Method of Manufacturing Wiring Board

Figure 3:
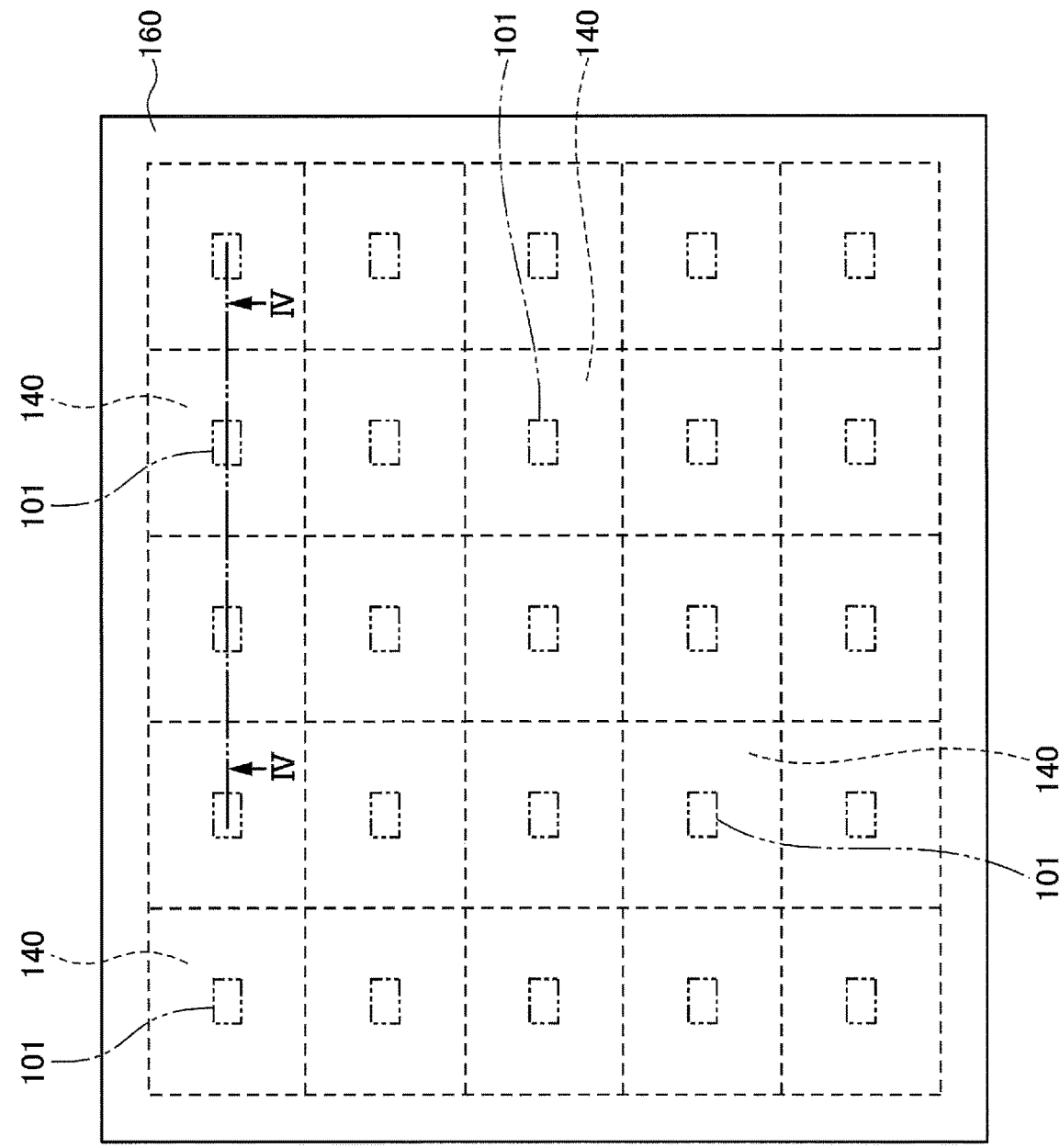
FIG. 3 is a plan view illustrating a support base used in a method of manufacturing the wiring board according to one embodiment.

Next, a method of manufacturing the wiring board 10 will be described. In this embodiment, a plurality of wiring boards 10 are manufactured from a single support base. FIG. 3 is a plan view illustrating the support base used for manufacturing the wiring board 10. FIG. 4A through FIG. 10B are cross sectional views illustrating the method of manufacturing the wiring board according to one embodiment. FIG. 4A through FIG. 10B illustrate changes in the cross section along a line IV-IV in FIG. 3. For sake of convenience, portions forming each of the constituent elements of the wiring board 10 will be described using the reference numerals designated for the final constituent elements.

First, as illustrated in FIG. 4A, a support base 160 is prepared. As illustrated in FIG. 3, the support base 160 includes a plurality of product areas 140 corresponding to wiring board 10 to be manufactured. The support base 160 may be made of a plate material having a high rigidity, such as silicon, glass, metals (for example, copper), or the like, for example. For example, a metal plate or a metal film may be used as the support base 160. The support base 160 in this example includes a support copper film having a thickness on the order of approximately 35 µm to approximately 70 µm, and an ultra-thin copper film having a thickness on the order of approximately 2 µm to approximately 5 µm adhered to the support copper film via a release layer, for example.

A region 101 where the opening 100 is to be formed, is provided in each product area 140. In addition, the product area 140 and the region 101 are inherited to each layer formed on the support base 160, such as the insulating layer 30 or the like.

Next, a metal film 161 is formed on an upper surface of the support base 160, to cover the entire upper surface of the support base 160. For example, the metal film 161 is formed on the upper surface of the ultra-thin copper film of the support base 160. The metal film 161 may be formed by a sputtering process, a vapor deposition process, an electroplating process, or the like, for example. A material usable for the metal film 161 includes a conductive material that becomes a stopper layer when removing the support base 160 by an etching process, for example. In addition, the material usable for the metal film 161 includes a conductive material that can be selectively etched with respect to the interconnect layer 20 (for example, Cu layer) formed at a latter process, for example. Examples of the conductive material usable for the metal film 161 include metals, such as nickel (Ni), titanium (Ti), chromium (Cr), tin (Sn), cobalt (Co), iron (Fe), palladium (Pd), or the like, and alloys containing at least one metal selected from a group of these metals, for example. The material used for the metal film 161 in this example is nickel. The metal film 161 in this example may have a thickness on the order of approximately 0.1 µm to approximately 1.0 µm, for example.

Next, the interconnect layer 20 is formed on the upper surface of the metal film 161. The interconnect layer 20 may be formed by a semi-additive method, for example. More particularly, a resist pattern (not illustrated), having an opening corresponding to the shape of the interconnect layer 20, is first formed on the upper surface of the metal film 161. Then, a copper plated film is deposited on the upper surface of the metal film 161 exposed through the opening in the resist pattern by electroplating copper, using the support base 160 and the metal film 161 as a power supply layer. The interconnect layer 20 can be formed on the metal film 161 by thereafter removing the resist pattern. The interconnect layer 20 may be formed using various interconnect forming methods other than the semi-additive method, such as a subtractive method.

Next, in the process illustrated in FIG. 4B, the insulating layer 30 having the through hole 30X, that exposes a portion of the upper surface of the interconnect layer 20, is formed on the upper surface of the metal film 161. For example, in a case where a resin film is used as the insulating layer 30, the resin film may be laminated on the upper surface of the metal film 161 by thermocompression bonding, and the resin film may be patterned by photolithography to form the insulating layer 30. On the other hand, in a case where a liquid or paste-like insulating resin is coated on the upper surface of the metal film 161 by a spin-coating process or the like, the insulating resin may be patterned by photolithography to form the insulating layer 30.

Next, in the process illustrated in FIG. 5A, the semi-additive method is used, for example, to form the via interconnect filling the through hole 30X, and form a conductor layer 40 on the upper surface of the insulating layer 30. The conductor layer 40 includes an interconnect layer 41 electrically connected to the interconnect layer 20 through the via interconnect filling the through hole 30X, and the metal layer 42 formed in the mounting area for the electronic component 110 (refer to FIG. 1). In this manner, an interconnect layer 170 including the interconnect layer 20 and the conductor layer 40 is formed, and the interconnect structure 180 including the interconnect layer 170 and the insulating layer 30 is formed. The product area 140, and the region 101 where the opening 100 is to be formed, are also inherited to the interconnect structure 180. In other words, the interconnect structure 180 includes a plurality of product areas 140, and a plurality of regions 101.

Next, in the process illustrated in FIG. 5B, the insulating layer 70, that covers the interconnect layer 41 and the metal layer 42, is formed on the upper surface of the insulating layer 30, similar to the process illustrated in FIG. 4B. The insulating layer 70 is formed to cover the entire upper surface and the entire side surface of each of the interconnect layer 41 and the metal layer 42.

A roughening process may be performed with respect to the conductor layer 40, after the conductor layer 40 is formed and before the insulating layer 70 is formed. The entire upper surface and the entire side surface of the conductor layer 40 may be roughened by this roughening process. For example, the roughening process may be performed by a blackening process, an etching process, a plating process, a blasting process, or the like.

Figure 11:
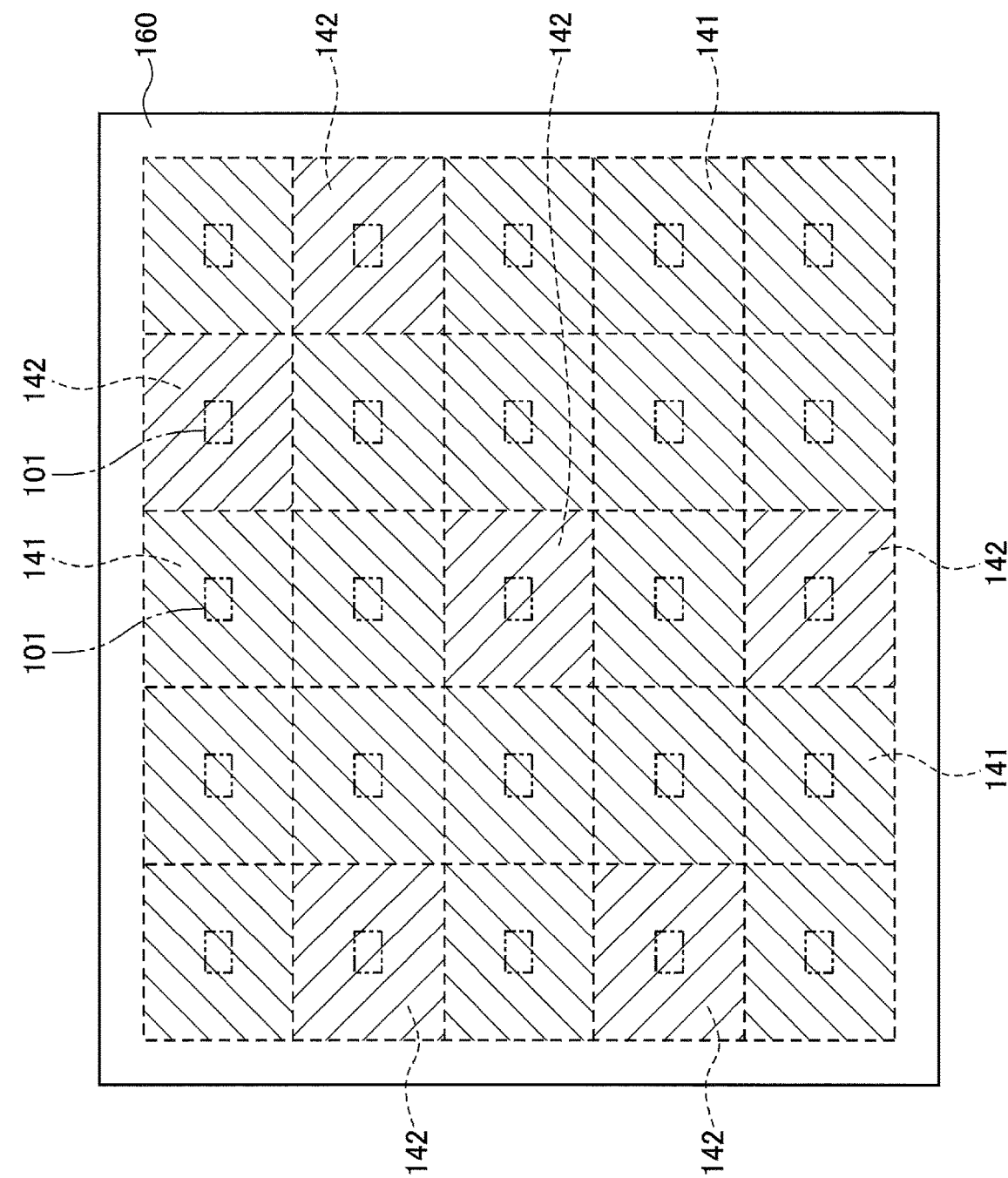
FIG. 11 is a diagram illustrating an example of product area classification results.

After the insulating layer 70 is formed, a determination is made as to determine whether the characteristics of the interconnect layer 170 satisfy a predetermined characteristic condition, for each of the plurality of product areas 140. In other words, the determination to determine whether the interconnect layer 170 is satisfactory or unsatisfactory, is performed. For example, an electrical resistance of the interconnect layer 170 is measured to determine whether the electrical resistance of the interconnect layer 170 falls within a predetermined range. Based on the result of measuring the electrical resistance, it is possible to detect defects generated in the interconnect layer 170, such as a short-circuit, an open-circuit, or the like. The plurality of product areas 140 are then classified into satisfactory areas 141 in which the characteristics of the interconnect layer 170 satisfy the predetermined characteristic condition, and unsatisfactory areas 142 in which the characteristics of the interconnect layer 170 do not satisfy the predetermined characteristic condition. An example of the classification results is illustrated in FIG. 11. In this example, the cross sections illustrated in FIG. 4A through FIG. 6B include the satisfactory area 141 and the unsatisfactory area 142, as illustrated in FIG. 11. The satisfactory area 141 is an example of a first product area, and the unsatisfactory area 142 is an example of a second product area.

After determining whether the interconnect layer 170 is satisfactory or unsatisfactory, the opening 100 is formed in the insulating layer 70 within the satisfactory area 141, an annular groove 150 is formed in the insulating layer 70 within the unsatisfactory area 142, and the electronic component 110 (refer to FIG. 1) is mounted inside the opening 100. FIG. 12A through FIG. 15B are plan views illustrating processes from the formation of the opening and the groove to the mounting of the electronic component. FIG. 12A, FIG. 13A, FIG. 14A, and FIG. 15A illustrate the satisfactory area 141, and FIG. 12B, FIG. 13B, FIG. 14B, and FIG. 15B illustrate the unsatisfactory area 142.

Figure 12A:
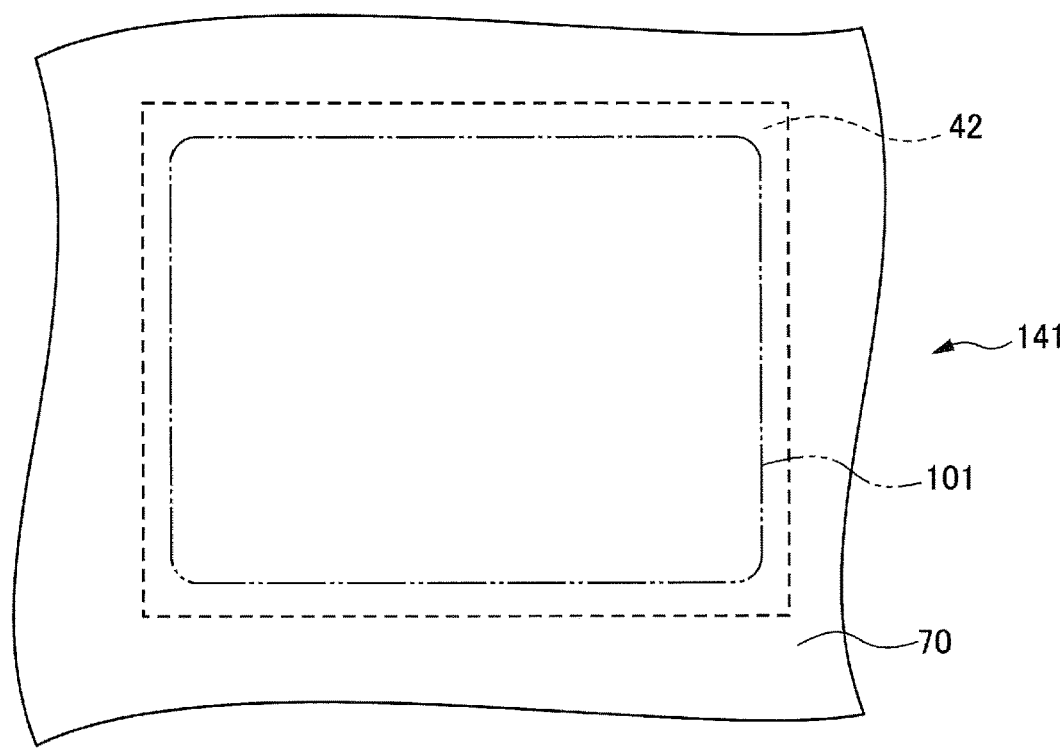
FIG. 12A and FIG. 12B are plan views (part 1) illustrating a process from the formation of an opening and a groove to the mounting of an electronic component.
Figure 12B:
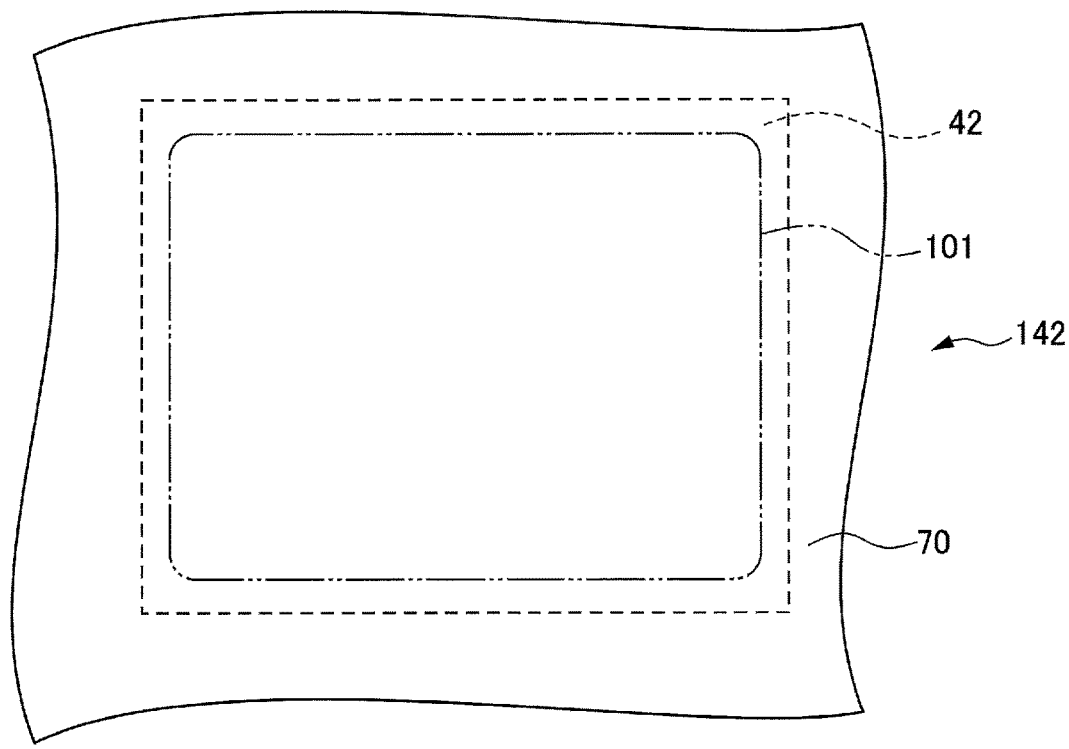

At a stage where the determination of whether the interconnect layer 170 is satisfactory or unsatisfactory ends, the entire upper surface of the metal layer 42 is covered by the insulating layer 70 in both the satisfactory area 141 and the unsatisfactory area 142, as illustrated in FIG. 12A and FIG. 12B.

Figure 13A:
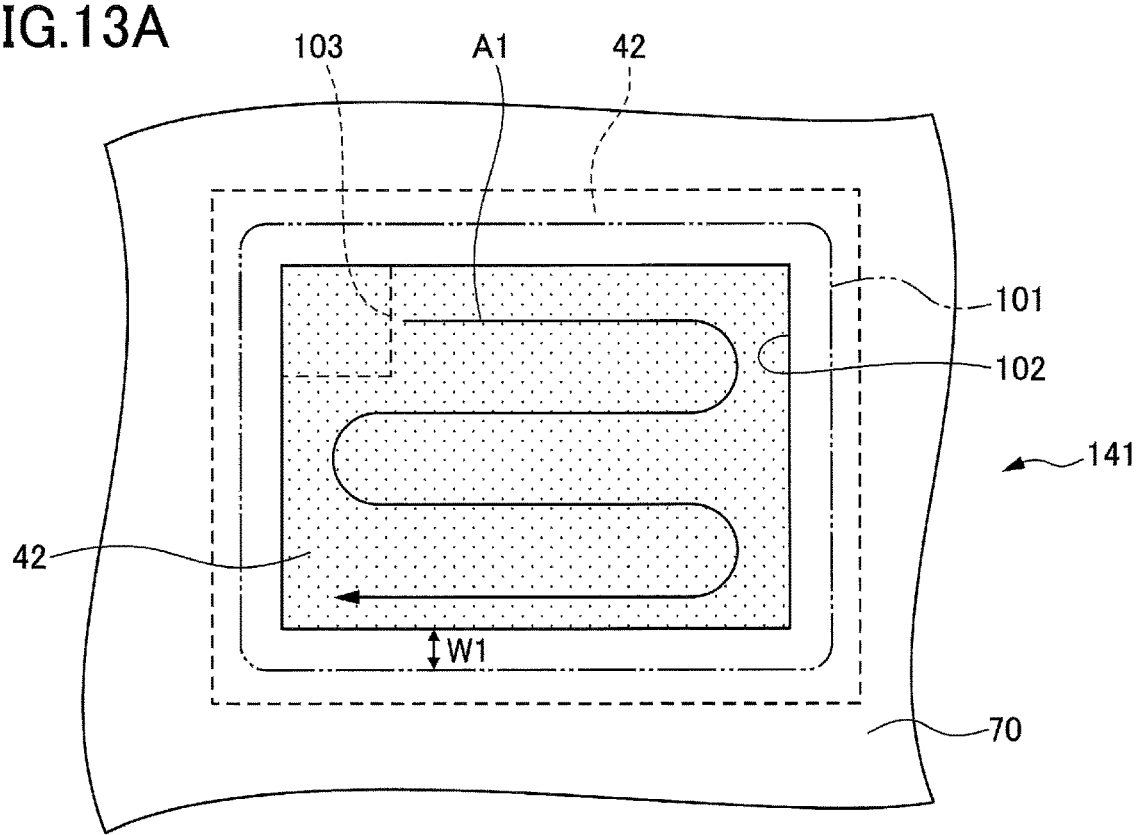
FIG. 13A and FIG. 13B are plan views (part 2) illustrating the process from the formation of the openings and the grooves to the mounting of the electronic component.
Figure 13B:
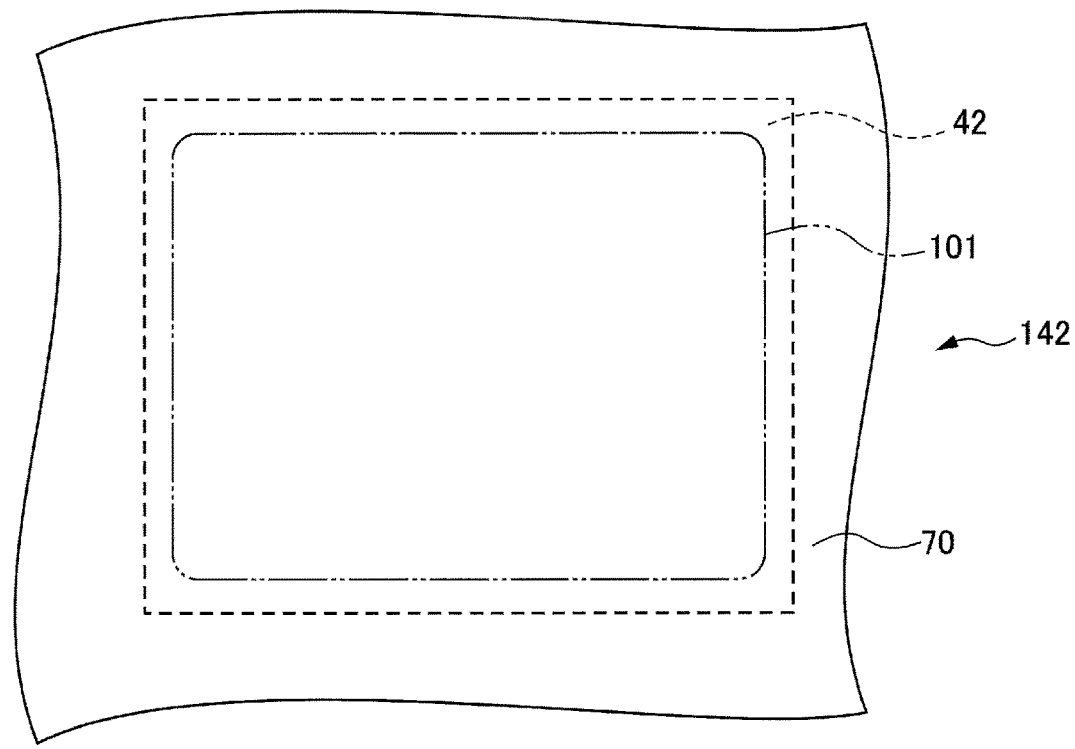

Next, in the process illustrated in FIG. 6A, and as also illustrated in FIG. 13A, in the satisfactory area 141, laser light is irradiated onto the insulating layer 70 under a first condition, to form a sub-opening 102 that is located on an inner side of the region 101 and penetrates the insulating layer 70 along the thickness direction thereof. When forming the sub-opening 102, a laser such as a $CO_2$ laser, a Yttrium Aluminum Garnet (YAG) laser, or the like, and a mask having a rectangular opening, for example, are used to form a rectangular spot 103 of the laser light. Then, as indicated by an arrow A1, the laser light is irradiated a plurality of times while moving the position of the spot 103. The sub-opening 102 can be formed in this manner. A portion of the upper surface of the metal layer 42 is exposed at a bottom of the sub-opening 102. The inner side of the sub-opening 102 is a vacant region, that is, a space, and a portion of the metal layer 42 is exposed at the vacant region. In addition, in the process illustrated in FIG. 6A, and as also illustrated in FIG. 13B, in the unsatisfactory area 142, the sub-opening 102 is not formed, and the state where the entire upper surface of the metal layer 42 is covered by the insulating layer 70 is maintained.

Figure 14A:
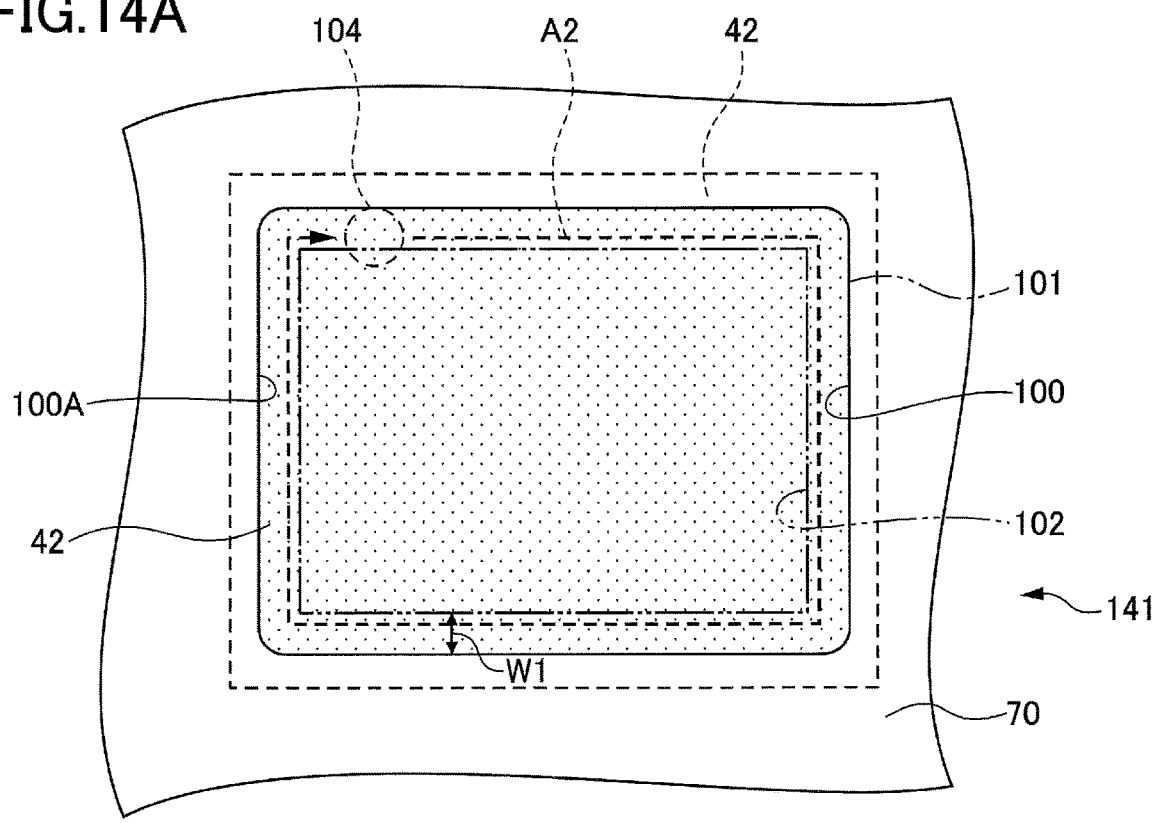
FIG. 14A and FIG. 14B are plan views (part 3) illustrating the process from the formation of the openings and the grooves to the mounting of the electronic component.
Figure 14B:
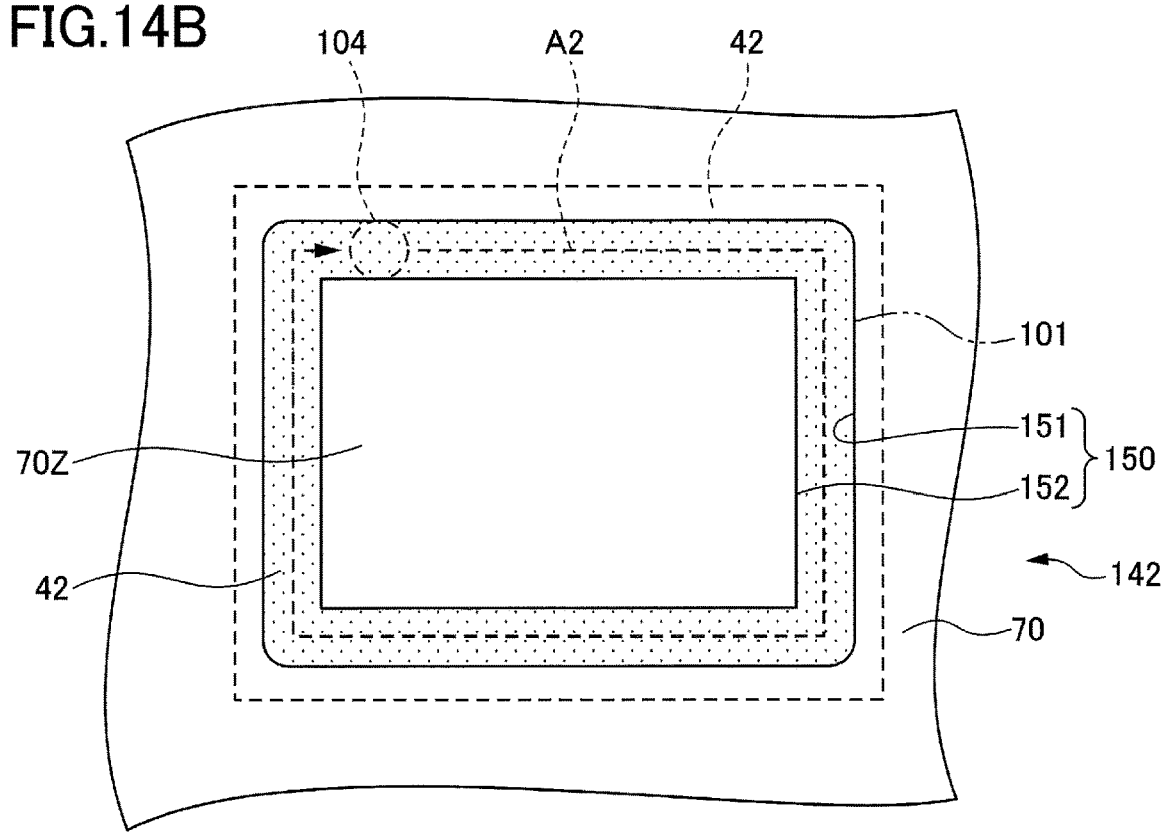

Next, in the process illustrated in FIG. 6B, and as also illustrated in FIG. 14A, in the satisfactory area 141, the laser light is irradiated onto the insulating layer 70 under a second condition different from the first condition, to remove a portion between the sub-opening 102 in the insulating layer 70 and the edge of the region 101. In addition, in the process illustrated in FIG. 6B, and as also illustrated in FIG. 14B, in the unsatisfactory area 142, the laser light is irradiated onto the insulating layer 70 under the second condition, to form the annular groove 150 that penetrates the insulating layer 70 along the thickness direction thereof. When removing the portion between the sub-opening 102 in the insulating layer 70 and the edge of the region 101, and forming the groove 150, the laser such as the $CO_2$ laser, or the YAG laser, or the like, and a mask having a circular opening, for example, are used to form a circular spot 104 of the laser light. Then, as indicated by an arrow A2, the laser light is irradiated a plurality of times while moving the position of the spot 104 along the edge of the region 101. In this manner, the portion between the sub-opening 102 in the insulating layer 70 and the edge of the region 101 can be removed in the satisfactory area 141, and the groove 150 can be formed in the unsatisfactory area 142. The opening 100 is formed by the removal of the portion between the sub-opening 102 in the insulating layer 70 and the edge of the region 101. A portion of the upper surface of the metal layer 42 is exposed at the bottom of the opening 100 and at the bottom of the groove 150. The inner side of the opening 100 is the vacant region, that is, the space, and a portion of the upper surface of the metal layer 42 is exposed at this vacant region. The insulating member 70Z, that is separated from the insulating layer 70 by the annular groove 150, is positioned at the inner side of the groove 150. The insulating member 70Z is surrounded by the groove 150. The insulating member 70Z serves as a dummy electronic component simulating the electronic component 110. For example, a volume of insulating member 70Z may be approximately the same as a volume of the laminated structure formed by the electronic component 110 and the adhesive layer 112. For example, the planar shape of the insulating member 70Z may be approximately the same as the planar shape of the electronic component 110.

As illustrated in FIG. 14B, the groove 150 includes an outer wall surface 151, and an inner wall surface 152, and the planar shape of the outer wall surface 151 matches the planar shape of the region 101. In addition, as illustrated in FIG. 14A, the planar shape of the wall surface 100A of the opening 100 also matches the planar shape of the region 101. Accordingly, the planar shape of the outer wall surface 151 of the groove 150, and the planar shape of the wall surface 100A of the opening 100 match each other. In this specification, the term "match" not only includes an exact or perfect match, but also includes relationships of shapes or the like that may generally be regarded as being a match, such as when the shapes or the like are approximately the same.

When forming the sub-opening 102, a width W1 of the portion between the sub-opening 102 in the insulating layer 70 and the edge of the region 101 (refer to FIG. 13A and FIG. 14A) is preferably less than or equal to a diameter of the spot 104. Otherwise, in a case where the width W1 is greater than the diameter of the spot 104, the portion between the sub-opening 102 in the insulating layer 70 and the edge of the region 101 cannot be removed sufficiently by simply moving the position of the spot 104 along the edge of the region 101.

As described above, when forming the opening 100, a rough process using the spot 103 under the first condition, and a precision process using the spot 104 under the second condition, are performed. The rough process under the first condition using the spot 103 may be performed after performing the precision process under the second condition using the spot 104. In other words, in the satisfactory area 141, after performing the precision process along the edge of the region 101 to form a groove similar to the groove 150, the insulating layer 70 remaining in an island-like shape on the inner side of the groove may be removed by the rough process.

Figure 15A:
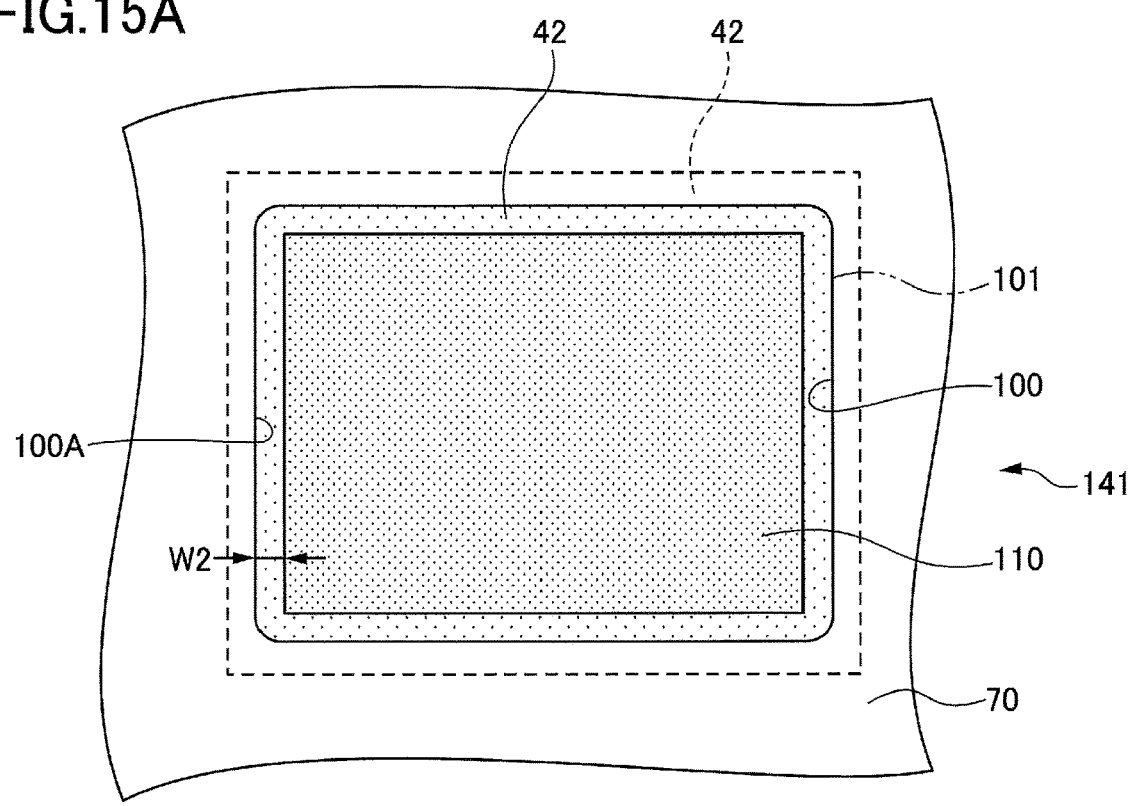
FIG. 15A and FIG. 15B are plan views (part 4) illustrating the process from the formation of the opening and the groove to the mounting of the electronic component.
Figure 15B:
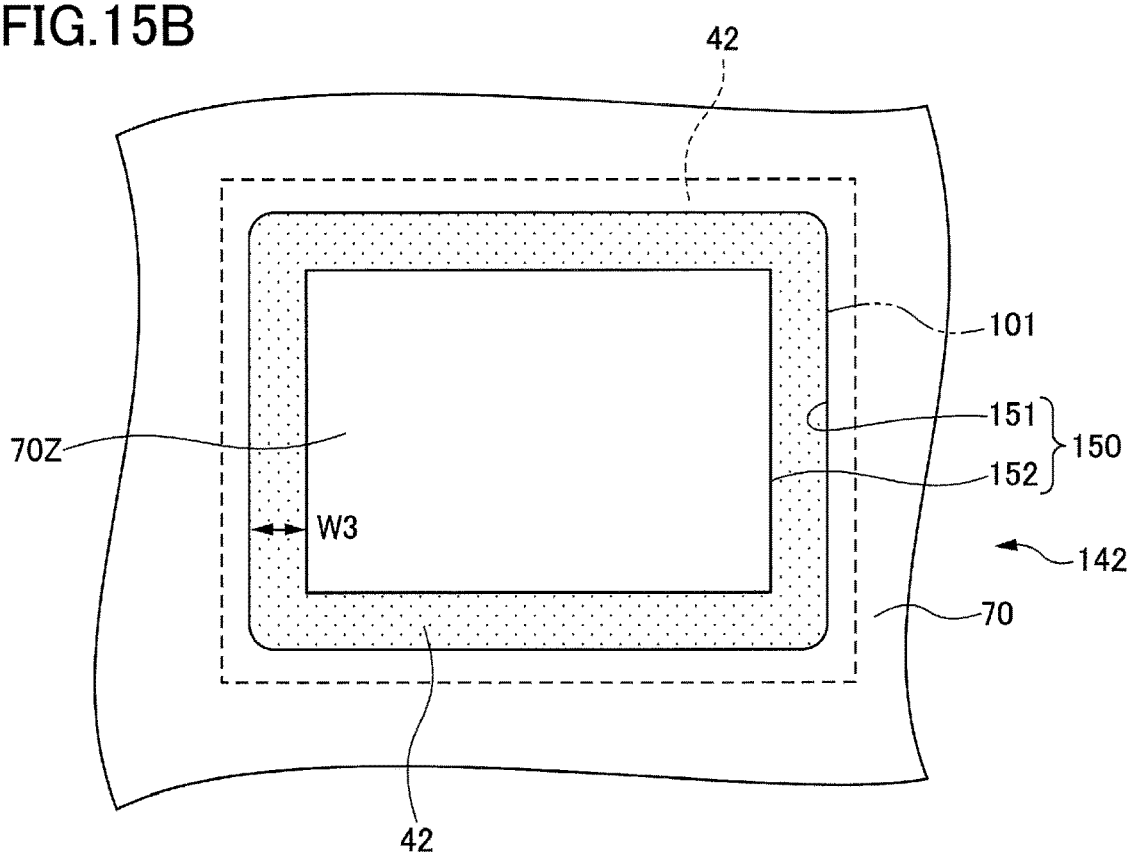

Next, in the process illustrated in FIG. 7A, and as also illustrated in FIG. 15A, in the satisfactory area 141, the adhesive layer 112 is formed on the upper surface of the metal layer 42 exposed from the opening 100. The adhesive layer 112 may be formed by coating a liquid resin or a resin paste that becomes the adhesive layer 112, for example, on the upper surface of the metal layer 42. An adhesive made of an epoxy-based resin, for example, may be used for the adhesive layer 112. In addition, the adhesive layer 112 used in this process is the A-stage adhesive. Alternatively, the adhesive layer 112 used in this process may be the B-stage adhesive. In the process illustrated in FIG. 7A, and as also illustrated in FIG. 15B, in the unsatisfactory area 142, a state where the insulating layer 70 remains on the inner side of the annular groove 150, is maintained.

After the adhesive layer 112 is famed, the electronic component 110 is mounted on the adhesive layer 112 inside the opening 100, using a mounter. In this state, the electronic component 110 is fixed to the adhesive layer 112 in the face-up state.

As illustrated in FIG. 15A, the electronic component 110 is mounted inside the opening 100 with an annular gap (or clearance) formed between the wall surface 100A of the opening 100 and the electronic component 110. A width W2 of this gap may be smaller than a width W3 of the groove 150 in the unsatisfactory area 142 (refer to FIG. 15B). Alternatively, the width W2 may be greater than width W3, and the width W2 and the width W3 may match. The width W2 is preferably as close as possible to the width W3. For example, the width W2 is preferably 90% or more and 110% or less than the width W3, because of the superior thickness uniformity obtainable for the insulating layer 80, as will be described below. The width W2 is an average value of the widths throughout the entire circumference of the gap. Moreover, the width W3 is an average value of the widths throughout the entire the groove 150.

A desmearing process may be performed after forming the opening 100 and the groove 150, and before forming the adhesive layer 112. The desmearing process can remove resin smears adhered to the exposed surface of the metal layer 42 exposed at the bottom of the opening 100 and the bottom of the groove 150.

After mounting the electronic component 110, in the process illustrated in FIG. 7B, the insulating layer 80 filling the opening 100 and the groove 150 is formed. The insulating layer 80 is formed so as to cover the entire surface of the electronic component 110 that is not in contact with the adhesive layer 112. The insulating layer 80 is formed so as to cover the entire upper surface of the insulating layer 70. In this state, the upper surface of the electrode terminal 111 of the electronic component 110 is formed on the same plane as the upper surface of the insulating layer 70, or on a plan lower than the upper surface of the insulating layer 70. In addition, a groove 150 formed in the unsatisfactory area 142 simulates the annular gap formed between the electronic component 110 in the satisfactory area 141 and the wall surface 100A of the opening 100. Accordingly, the upper surface of the insulating layer 80 can be made flat, while reducing variations in the thickness of the insulating layer 80.

Hence, in the state illustrated in FIG. 6B, for example, a center portion of the metal layer 42 inside the opening 100 is exposed inside the opening 100, while a center portion of the metal layer 42 inside the groove 150 is covered by the insulating member 70Z. Further, in the state illustrated in FIG. 7A, for example, the center portion of the metal layer 42, exposed inside the opening 100, is covered by the electronic component 110 via the adhesive layer 112. In this example, the center portion of the metal layer 42 inside the groove 150 is covered by the insulating member 70Z, that is, the insulating member 70Z is provided directly on the metal layer 24 in the unsatisfactory area 142.

Figure 8A:
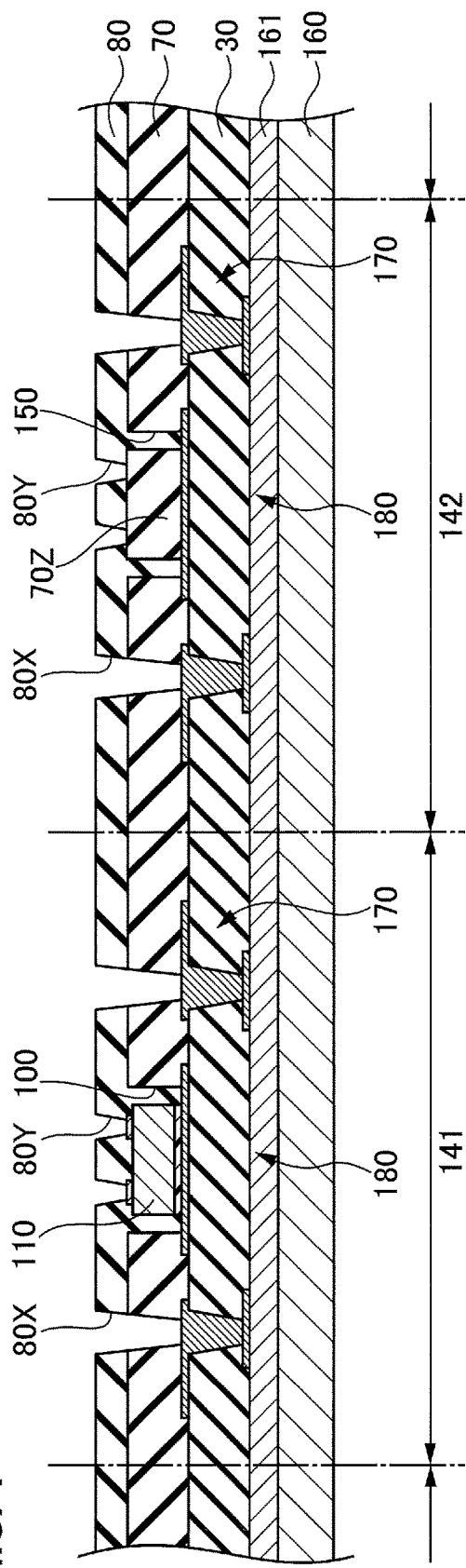
FIG. 8A and FIG. 8B are cross sectional views (part 5) illustrating the method of manufacturing the wiring board according to one embodiment.

Next, in the process illustrated in FIG. 8A, the through hole 80X, that continuously penetrates the insulating layers 70 and 80 in the thickness direction thereof, is formed at the predetermined position of the insulating layers 70 and 80, and the through hole 80Y is formed at the predetermined position of the insulating layer 80. These through holes 80X and 80Y can be formed by a laser machining process using the $CO_2$ laser, the YAG laser, or the like, for example.

Figure 8B:
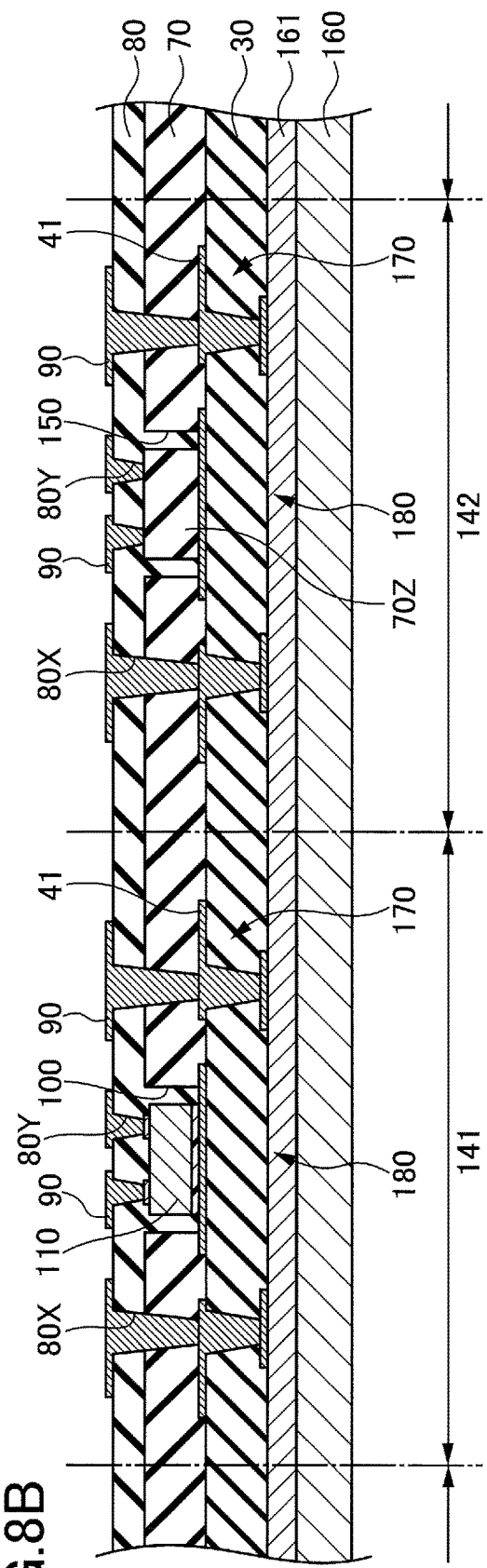

Next, in the process illustrated in FIG. 8B, the via interconnect filling the through holes 80X and 80Y is formed by the semi-additive method, for example, and the interconnect layer 90 that electrically connects to the interconnect layer 41 or the electrode terminal 111 through the via interconnect is laminated on the upper surface of the insulating layer 80.

Next, in the process illustrated in FIG. 9A, the solder resist layer 130 including the opening 130X is laminated on the upper surface of the insulating layer 80. The solder resist layer 130 may be formed by laminating a photosensitive solder resist film, or coating a liquid solder resist, for example, and patterning the solder resist into a desired shape. By performing this process, the interconnect layer 90 exposed from the opening 130X becomes the pad P2. A metal layer (that is, a surface-treated layer), formed by laminating a Ni layer and a Au layer in this order, for example, may be formed on the pad P2, as appropriate. This metal layer may be formed by electroless plating, for example.

Next, the support base 160 is removed. For example, the support copper film of the support base 160 is mechanically stripped from the ultra-thin copper film. In this state, a release layer is interposed between the support copper film and the ultra-thin copper film, and the adhesion between the support copper film and the ultra-thin copper film is weak. Therefore, the support copper film can easily be stripped from the ultra-thin copper film. Thereafter, the ultra-thin copper film remaining on the metal film 161 is removed by a wet etching using an aqueous solution of ferric chloride, an aqueous solution of cupric chloride, an aqueous solution of ammonium persulfate, or the like, for example. In this state, the metal film 161 functions as a stopper layer when etching the ultra-thin copper film of the support base 160.

Next, the metal film 161 is removed by etching. For example, when Ni is used as the material forming the metal film 161, the metal film 161 is selectively etched with respect to the interconnect layer 20 (Cu layer) by a wet etching using a hydrogen peroxide-nitric acid based solution, and removed. In this state, the interconnect layer 20 and the insulating layer 30 function as stopper layers when etching the metal film 161. This process exposes the lower surface of the interconnect layer 20 and the lower surface of the insulating layer 30, as illustrated in FIG. 9B. Further, the lower surface of the interconnect layer 20 and the lower surface of the insulating layer 30, which are in contact with the upper surface of the metal film 161 (refer to FIG. 9A), are formed to a shape along the upper surface (flat surface in this example) of the metal film 161. For this reason, the lower surface of the interconnect layer 20 and the lower surface of the insulating layer 30 are formed approximately on the same plane.

Figure 10A:
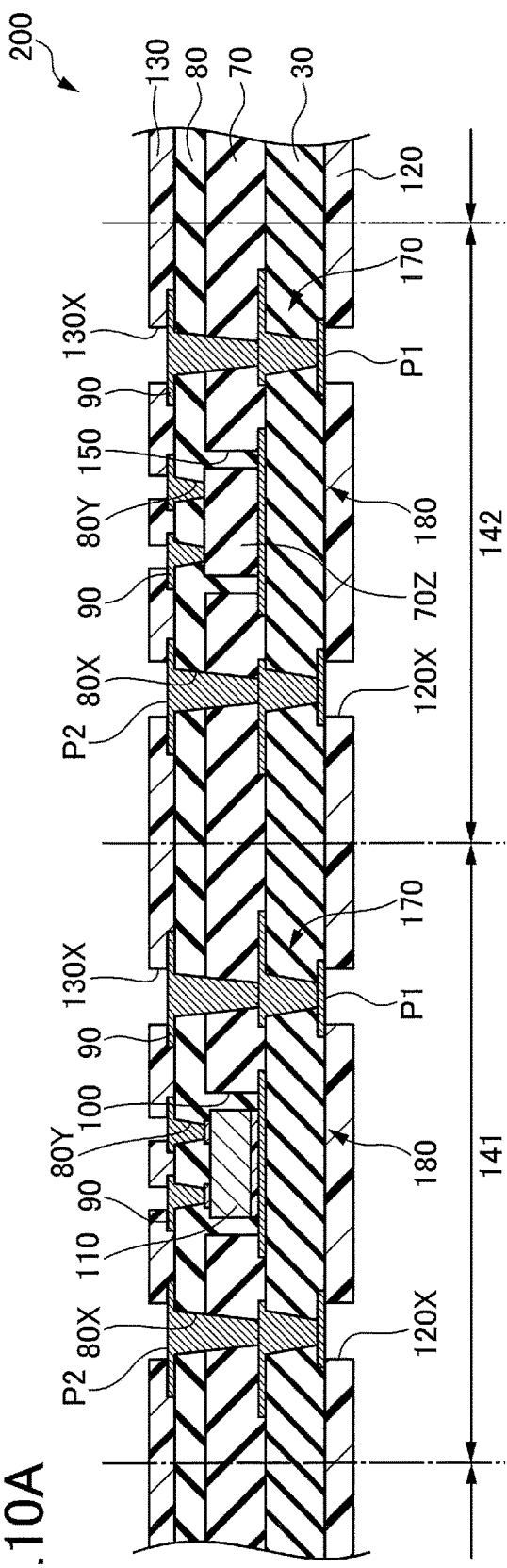
FIG. 10A and FIG. 10B are cross sectional views (part 7) illustrating the method of manufacturing the wiring board according to one embodiment.

Next, in the process illustrated in FIG. 10A, and as in the process illustrated in FIG. 9A, the solder resist layer 120 including the opening 120X is laminated on the upper surface insulating layer 30. By performing this process, the interconnect layer 20 exposed from the opening 120X becomes pad P1. A metal layer (that is, a surface-treated layer), formed by laminating a Ni layer and a Au layer in this order, for example, may be formed on the pad P1, as appropriate. This metal layer may be formed by electroless plating, for example.

Accordingly, a laminated structure 200, including the satisfactory area 141 and the unsatisfactory area 142, can be obtained.

The laminated structure 200 has the interconnect structure 180 including the interconnect layer 170 provided with the satisfactory area 141 and the unsatisfactory area 142, and the insulating 70 formed on the upper surface of interconnect structure 180. In the satisfactory area 141, the opening 100 is formed to penetrate the insulating layer 70 along the thickness direction thereof. In the unsatisfactory area 142, the annular groove 150 is formed to penetrate the insulating layer 70 along the thickness direction thereof. The laminated structure 200 includes, in the satisfactory area 141, the electronic component 110 mounted inside the opening 100 with the annular gap formed between the electronic component 110 and the wall surface 100A of the opening 100. The laminated structure 200 also includes, in the unsatisfactory area 142, the insulating member 70Z positioned on the inner side of the groove 150. The laminated structure 200 further includes the insulating layer 80, filling the gap and groove 150 and covering the insulating layer 70, the electronic component 110, and the insulating member 70Z, and the interconnect layer 90 formed on the upper surface of the insulating layer 80 and electrically connected to the interconnect layer 170.

Figure 10B:
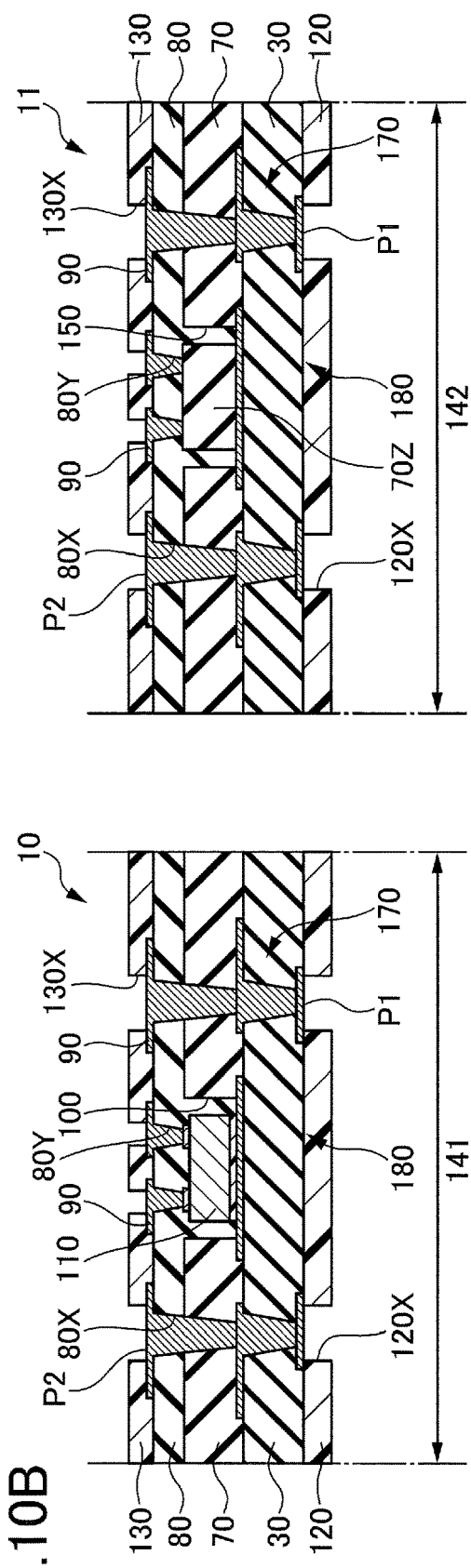

Next, in the process illustrated in FIG. 10B, the laminated structure 200 is cut along the boundaries of the product areas 140, into individual pieces, using a slicer or the like. As a result, the wiring board 10 provided with the electronic component 110 can be obtained from the satisfactory area 141, and a dummy wiring board 11 not provided with the electronic component 110 can be obtained from the unsatisfactory area 142.

According to this embodiment, the cost of the electronic component 110 and the adhesive layer 112 can be reduced, because the electronic component 110 is not mounted within the unsatisfactory area 142. In addition, since the unsatisfactory area 142 is not irradiated with the laser light under the first condition using the spot 103, the number of processes can be reduced by a corresponding amount. Further, because the groove 150 is formed in the unsatisfactory area 142, it is possible to reduce the variations in the thickness of the insulating layer 80. Consequently, according to this embodiment, the cost can be reduced while avoiding the deterioration of the connection reliability.

In particular, since the planar shape of the wall surface 151 of the groove 150 and the planar shape of the wall surface 100A of the opening 100 match each other, the variations in the thickness of the insulating layer 80 can easily be reduced.

Modifications

Next, modifications of the embodiment will be described.

Structure of Wiring Board

Figure 16:
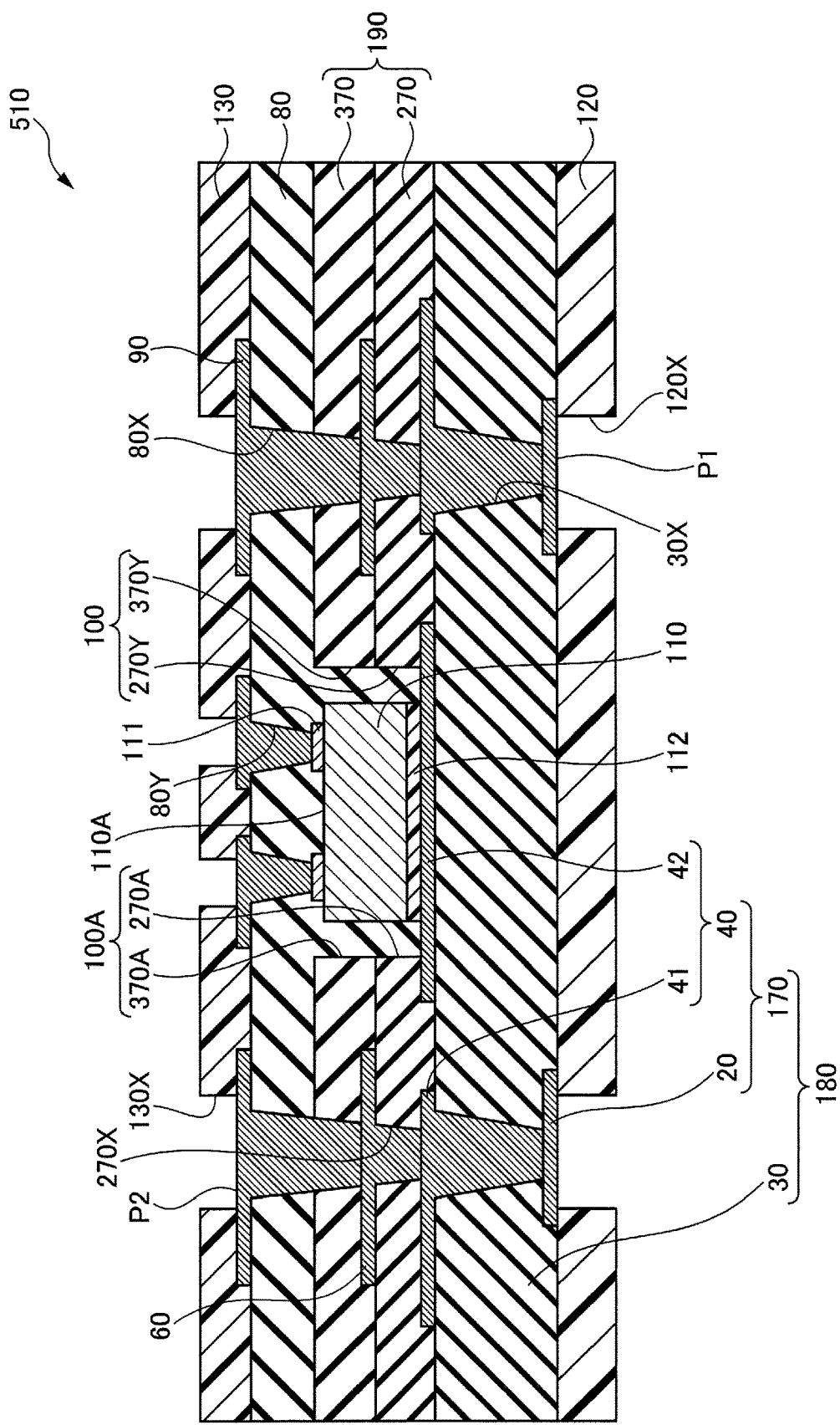
FIG. 16 is a cross sectional view illustrating the structure of the wiring board manufactured according to a modification of the embodiment.

First, a structure of the wiring board manufactured according to a modification of the embodiment of the present disclosure will be described. FIG. 16 is a cross sectional view illustrating the structure of the wiring board.

As illustrated in FIG. 16, a wiring board 510 manufactured according to the modification of the embodiment has a structure including the interconnect layer 20, the insulating layer 30, the conductor layer 40, an insulating layer 270, the interconnect layer 60, an insulating layer 370, the insulating layer 80, and the interconnect layer 90 that are successively laminated. The wiring board 510 in this example has the so-called "coreless board" structure, similar to the wiring board 10. The interconnect layer 20, the insulating layer 30, the conductor layer 40, and the insulating layer 80 have the same structure as those of the embodiment described above.

The wiring board 510 includes one or a plurality of (one in this example) electronic components 110 arranged inside the openings 100 formed in an insulating layer 190 that includes the insulating layer 270 and the insulating layer 370, the solder resist layer 120 laminated on the lower surface of the insulating layer 30, and the solder resist layer 130 laminated on the upper surface of the insulating layer 80. The electronic component 110, the solder resist layer 120, and the solder resist layer 130 have the same structure as those of the embodiment described above. The insulating layer 190 is an example of the first insulating layer.

Copper (Cu) and copper alloys, for example, may be used as the material faulting the interconnect layer 60. Insulating resins, such as epoxy resins, polyimide resins, or the like, and resin materials containing a filler such as silica, alumina, or the like in such insulating resins, for example, may be used as the material forming the insulating layers 270 and 370. Further, an insulating resin including a reinforcing material, such as woven or non-woven fabric of glass, aramid, and Liquid Crystal Polymer (LCP) fibers impregnated with a thermosetting resin including an epoxy resin, a polyimide resin, or the like as a main component thereof, for example, may also be used as the material forming the insulating layers 270 and 370. A non-photosensitive insulating resin including a main component having a thermosetting property, and an insulating resin including a photosensitive resin as a main component thereof, for example, may also be used as the material forming the insulating layers 270 and 370.

The insulating layer 270 is formed on the upper surface of the insulating layer 30, so as to cover the conductor layer 40. The thickness from the upper surface of the conductor layer 40 to the upper surface of the insulating layer 50 may be on the order of approximately 40 μm to approximately 100 μm, for example.

A through hole 270X is formed at predetermined positions of the insulating layer 270 to penetrate the insulating layer 270 along a thickness direction thereof, to expose a portion of the upper surface of the conductor layer 40 (interconnect layer 41 in this example). The through hole 270X is formed to a tapered shape so that the opening width (or opening diameter) becomes smaller from the upper side (on the side of the interconnect layer 60) toward the lower side (on the side of the conductor layer 40) in FIG. 16, for example. For example, the through hole 270X is formed to an inverted truncated cone shape so that the opening diameter at the lower open end is smaller than the opening diameter at the upper open end.

The interconnect layer 60 includes an interconnect layer that electrically connects to the interconnect layer 41 through the via interconnect filling the through hole 270X. The interconnect layer 60 is formed integrally with the via interconnect filling the through hole 270X. The thickness of the interconnect layer 60 may be on the order of approximately 10 μm to approximately 30 μm, for example.

The insulating layer 370 is formed on the upper surface of the insulating layer 270, so as to cover the interconnect layer 60. The thickness from the upper surface of the interconnect layer 60 to an upper surface of the insulating layer 370 may be on the order of approximately 40 μm to approximately 100 μm, for example.

The opening 100 in this example is formed by a through hole 270Y that penetrates the insulating layer 270 along the thickness direction thereof, and a through hole 370Y that penetrates the insulating layer 370 along the thickness direction thereof.

The insulating layer 80 is formed to cover the entire side surface 270A of the insulating layer 270, the entire side surface 370A of the insulating layer 370, and the entire upper surface of the insulating layer 370, for example. The through hole 80X is formed at predetermined positions of the insulating layers 370 and 80 to penetrate the insulating layers 370 and 80 along a thickness direction thereof, to expose a portion of the upper surface of the interconnect layer 60. Further, the through hole 80Y is formed at a predetermined position of the insulating layer 80 to penetrate the insulating layer 80 along the thickness direction thereof, to expose a portion of the upper surface of the electrode terminal 111. The through holes 80X and 80Y are respectively formed to a tapered shape so that the opening width (or opening diameter) becomes smaller from the upper side (on the side of the interconnect layer 90) toward the lower side (on the side of the interconnect layer 60 or on the side of the electrode terminal 111) in FIG. 16, for example. For example, the through holes 80X and 80Y are respectively formed to an inverted truncated cone shape so that the opening diameter at the lower open end is smaller than the opening diameter at the upper open end. The side surface 270A of the insulating layer 270 and the side surface 370A of the insulating layer 370 also form the wall surface 100A defining the opening 100.

The interconnect layer 90 is formed on the upper surface of the insulating layer 80. The interconnect layer 90 is the outermost interconnect layer (uppermost interconnect layer in this example) of the wiring board 10, for example. The interconnect layer 90 includes an interconnect layer that electrically connects to the interconnect layer 60 through the via interconnect filling the through hole 80X. The interconnect layer 90 includes an interconnect layer that electrically connects to the electrode terminal 111 through the via interconnect filling the through hole 80Y. The interconnect layer 90 is formed integrally with the via interconnect filling the through hole 80X or the through hole 80Y. The interconnect layer 90 may have a thickness on the order of approximately 10 μm to approximately 30 μm, for example.

Otherwise, the structure of the wiring board 510 according to this modification is similar to that of the wiring board 10.

Method of Manufacturing Wiring Board

Next, a method of manufacturing the wiring board 510 will be described. In this modification, a plurality of wiring boards 510 are manufactured from a single support base. In the following description, elements that differ from those of the embodiment described above will mainly be described. FIG. 17A through FIG. 19B are cross sectional views illustrating the method of manufacturing the wiring board according to the variation of the embodiment. For the sake of convenience, portions forming each of the constituent elements of the wiring board 510 will be described using the reference numerals designated for the final constituent elements.

First, the processes up to the formation of the conductor layer 40 are performed similar to the embodiment (refer to FIG. 5A). After forming the conductor layer 40, a roughening process may be performed with respect to the conductor layer 40. Then, in the process illustrated in FIG. 17A, and as in the process illustrated in FIG. 4B, the insulating layer 270 having the through hole 270X that exposes a portion of the upper surface of the interconnect layer 41 is formed on the upper surface of the insulating layer 30. The insulating layer 270 is formed to cover the entire upper surface and the entire side surface of the metal layer 42.

Figure 17A:
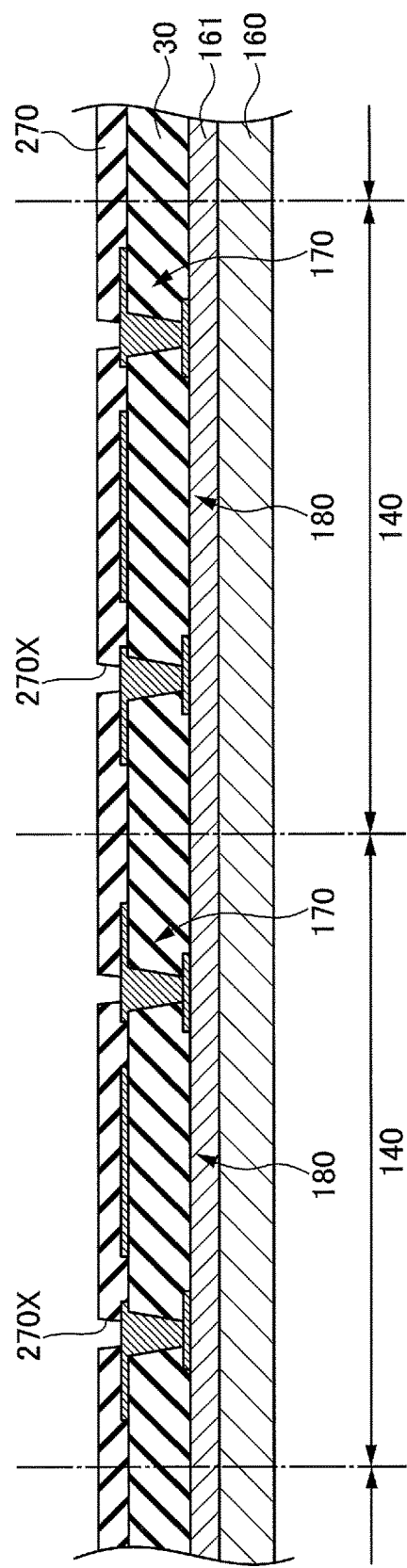
FIG. 17A and FIG. 17B are cross sectional views (part 1) illustrating the method of manufacturing the wiring board according to the modification of the embodiment.
Figure 17B:
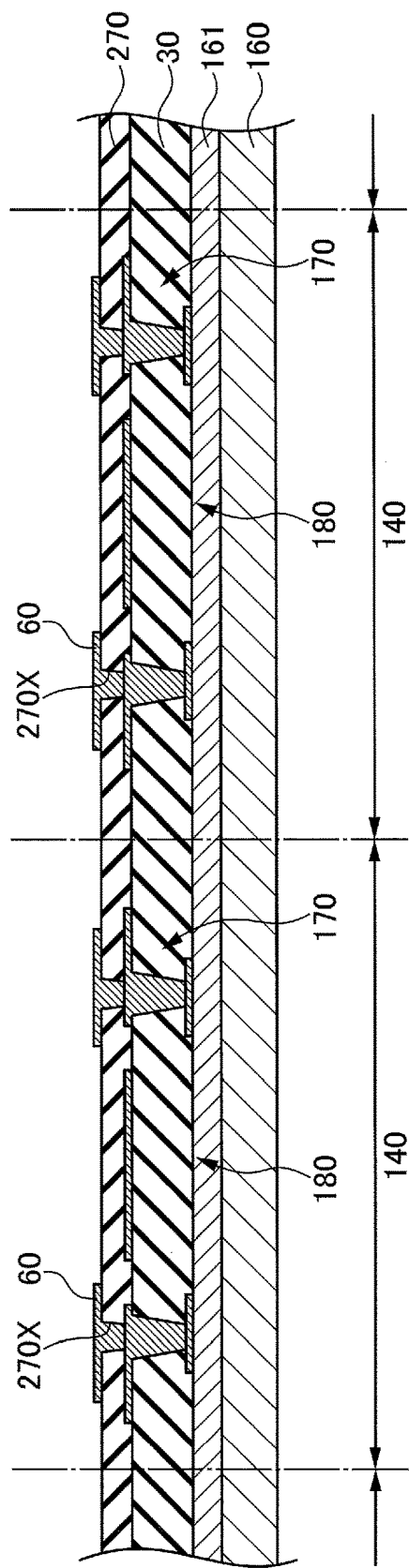

Next, in the process illustrated in FIG. 17B, the via interconnect filling the through hole 270X is formed, and the interconnect layer 60 is formed on the upper surface of the insulating layer 270, by a semi-additive method, for example. The interconnect layer 60 includes an interconnect layer that electrically connects to the interconnect layer 41 through the via interconnect filling the through hole 270X.

Next, in the process illustrated in FIG. 18A, and as in the process illustrated in FIG. 17A, the insulating layer 370 is famed on the upper surface of the insulating layer 270, so as to cover the interconnect layer 60. The insulating layer 370 is formed to cover the entire upper surface and the entire side surface of the interconnect layer 60. The insulating layer 270 and the insulating layer 370 are included in the insulating layer 190.

A roughening process may be performed with respect to the interconnect layer 60, after forming the interconnect layer 60 and before forming the insulating layer 370. By this roughening process, the entire upper surface and the entire side surface of the interconnect layer 60 may be formed into roughened surfaces. For example, the roughening process may be performed by the blackening process, the etching process, the plating process, the blasting process, or the like.

After forming the insulating layer 370, a determination is made as to determine whether the characteristics of the interconnect layer 170 satisfy the predetermined characteristic condition, for each of the plurality of product areas 140, similar to the embodiment described above. The plurality of product areas 140 are then classified into the satisfactory areas 141 in which the characteristics of the interconnect layer 170 satisfy the predetermined characteristic condition, and the unsatisfactory areas 142 in which the characteristics of the interconnect layer 170 do not satisfy the predetermined characteristic condition.

After determining whether the interconnect layer 170 is satisfactory or unsatisfactory, in the process illustrated in FIG. 18B, the opening 100 is formed in the insulating layer 190 within the satisfactory area 141, the annular groove 150 is formed in the insulating layer 190 within the unsatisfactory area 142, and the electronic component 110 is mounted inside the opening 100, similar to the embodiment. The inner side of the opening 100 is a vacant region, that is, a space, and a portion of the metal layer 42 is exposed at the vacant region. An insulating member 190Z, including an insulating member 270Z separated from the insulating layer 270 by the annular groove 150, and an insulating member 370Z separated from the insulating layer 370 by the groove 150, is positioned on the inner side of the groove 150. The insulating member 190Z is surrounded by the groove 150. The insulating member 190Z serves as a dummy electronic component simulating the electronic component 110. For example, a volume of the insulating member 190Z may be approximately the same as a volume of the laminated structure formed by the electronic component 110 and the adhesive layer 112. For example, the planar shape of the insulating member 190Z may be approximately the same as the planar shape of the electronic component 110.

Figure 19A:
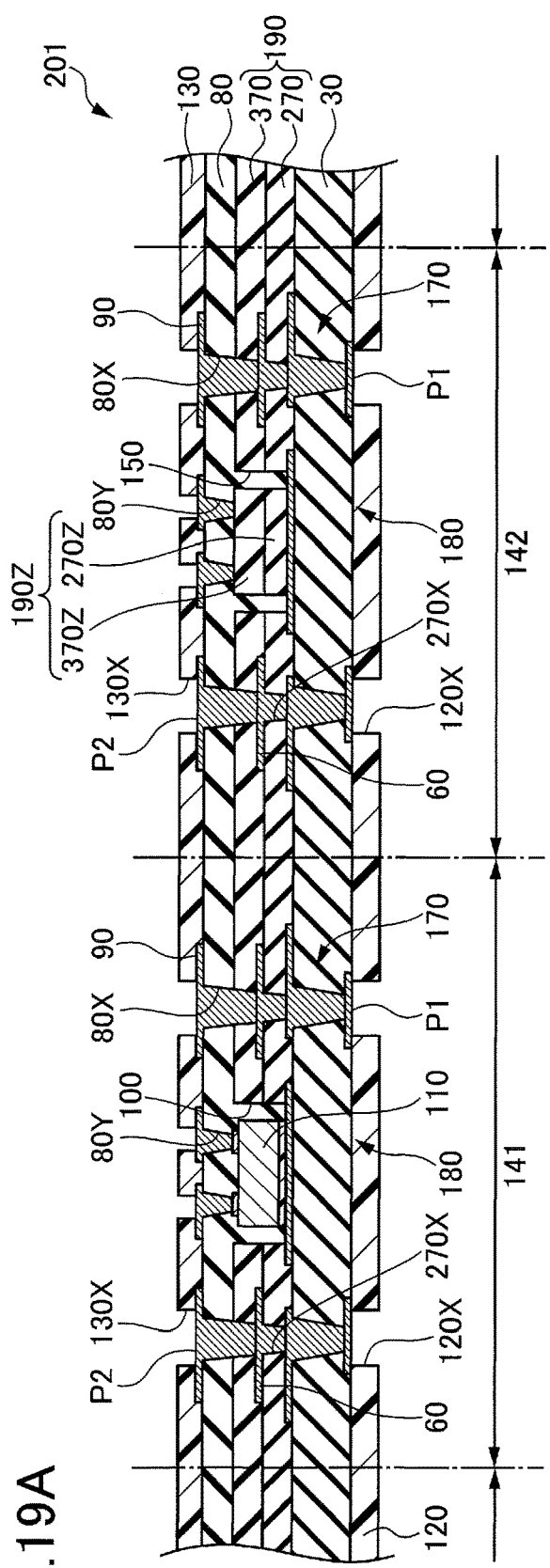
FIG. 19A and FIG. 19B are cross sectional views (part 3) illustrating the method of manufacturing the wiring board according to the modification of the embodiment.

Thereafter, the processes from the formation of the insulating layer 80 to the lamination of the solder resist layer 120 are performed, similar to the embodiment. Hence, as illustrated in FIG. 19A, a laminated structure 201 including the satisfactory area 141 and the unsatisfactory area 142 can be obtained. The interconnect layer 90 may include an interconnect layer that makes contact with the insulating member 190Z.

Figure 19B:
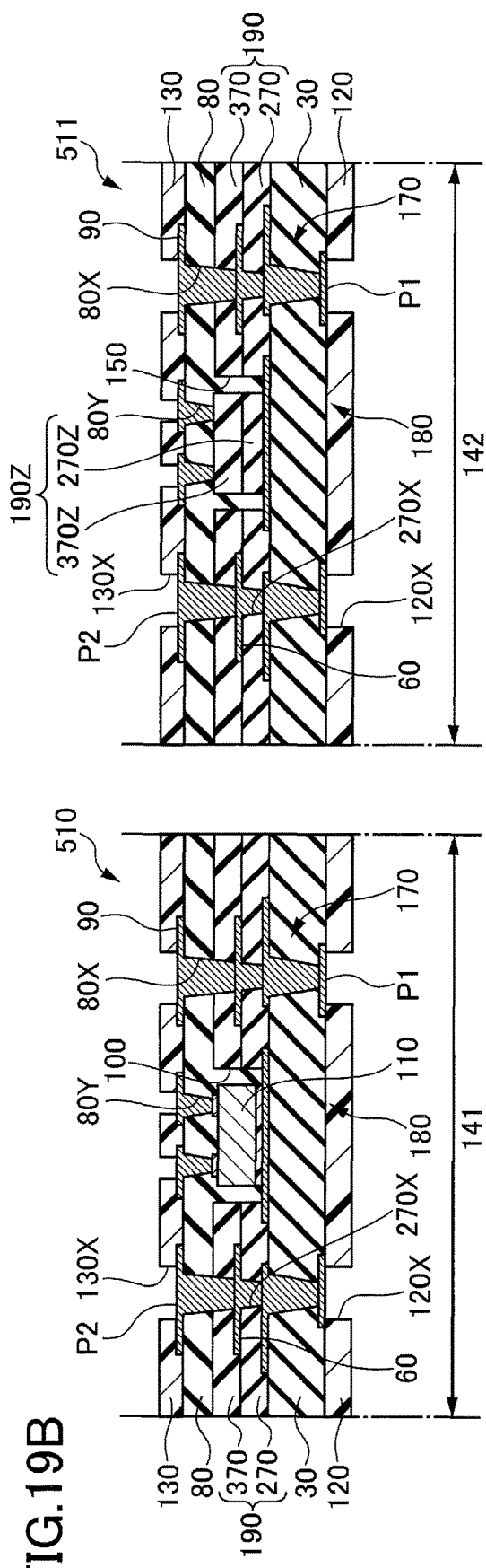

Next, in the process illustrated in FIG. 19B, the laminated structure 201 is cut along the boundaries of the product areas 140, into individual pieces, using the slicer or the like. As a result, the wiring board 510 provided with the electronic component 110 can be obtained from the satisfactory area 141, and a dummy wiring board 511 not provided with the electronic component 110 can be obtained from the unsatisfactory area 142.

According to this modification, it is possible to reduce the cost, while avoiding the deterioration of the connection reliability, similar to the embodiment.

According to the present disclosure, the first insulating layer may include two or more insulating layers, as in the modification. Further, according to the present disclosure, the interconnect structure may include three or more interconnect layers.

Accordingly to each of the embodiments and modifications described above, it is possible to reduce the cost of the laminated structure and the method of manufacturing the wiring board.

Various aspects of the subject-matter described herein may be set out non-exhaustively in the following numbered clauses:

1. A method of manufacturing a wiring board, comprising:
   forming a first conductor layer on an upper surface of a first insulating layer that includes a plurality of product areas;
   determining whether or not characteristics of the first conductor layer satisfy a predetermined characteristic condition for each of the plurality of product areas;
   forming an opening that penetrates the first insulating layer along a thickness direction thereof in each of first product areas in which the first conductor layer satisfies the predetermined characteristic condition;
   forming an annular groove that penetrates the first insulating layer along the thickness direction thereof in each of second product areas in which the first conductor layer does not satisfy the predetermined characteristic condition, and positioning an insulating member separate from the first insulating layer inside the annular groove;
   mounting an electronic component inside the opening in each of the first product areas, so as to form an annular gap between the electronic component and a wall surface defining the opening;
   forming a second insulating layer that fills the annular gap and the annular groove, and covers the first insulating layer, the electronic component, and the insulating member;
   forming a second conductor layer on an upper surface of the second insulating layer, electrically connecting to the first conductor layer and the electronic component in the first product areas, and electrically connecting to the second conductor layer in the second product areas; and
   cutting a laminated structure formed by the first insulating layer, the first conductor layer, the electronic component, the second insulating layer, and the second conductor layer, along boundaries of the plurality of product areas, into individual pieces each forming the wiring board.

2. The method of manufacturing the wiring board according to clause 1, wherein
   the groove has an outer first wall surface, and an inner second wall surface, and
   a planar shape of the first wall surface and a planar shape of the wall surface of the opening match each other.

3. The method of manufacturing the wiring board according to clause 1 or 2, wherein the opening has a rectangular planar shape.

4. The method of manufacturing the wiring board according to any one of clauses 1 to 3, wherein the forming the opening in each of the first product areas includes
   irradiating laser light onto the first insulating layer under a first condition, to form a sub-opening that penetrates the first insulating layer along the thickness direction thereof on an inner side of a region where the opening is to be formed, and
   irradiating laser light onto the first insulating layer under a second condition different from the first condition, to remove a portion between the sub-opening in the first insulating layer and an edge of the region where the opening is to be formed.

5. The method of manufacturing a wiring board according to clause 4, wherein the forming the annular groove in each of the second product areas includes
   irradiating the laser light onto the first insulating layer under the second condition.

6. The method of manufacturing the wiring board according to clause 4 or 5, wherein the sub-opening has a rectangular planar shape.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A laminated structure comprising:
a first product area including a first part of the laminated structure in a thickness direction of the laminated structure;
a second product area adjacent to the first product area, the second product area including a second part of the laminated structure in the thickness direction of the laminated structure;
a first insulating layer included in the first product area and the second product area;
a second insulating layer formed on the upper surface of the first insulating layer;
an opening defined by a first wall surface of the second insulating layer, included in the first product area, penetrating the second insulating layer along a thickness direction of the second insulating layer, and exposing a center portion of the first conductor layer, wherein an outer edge of the first conductor layer is covered by the second insulating layer;
an annular groove defined by mutually opposing outer second wall surface and inner third wall surface of the second insulating layer, included in the second product area, penetrating the second insulating layer along the thickness direction of the second insulating layer, and exposing a portion of the second conductor layer between the second wall surface and the third wall surface of the second insulating layer;
an electronic component mounted on the first conductor layer inside the opening at a center portion of the opening in the first product area with an annular gap between a side surface of the electronic component and the first wall surface opposing the side surface of the electronic component, wherein the annular gap exposes first conductor layer;
an insulating member located on the second conductor layer inside the annular groove at a center portion of the second conductor layer in the second product area, wherein the third wall surface of the second insulating layer forms a side surface of the insulating member;
a third insulating layer that fills the annular gap and the annular groove, and covers the second insulating layer, the electronic component, and the insulating member;
a third interconnect layer formed on an upper surface of the third insulating layer in the first product area, and electrically connected to each of the first interconnect layer and the electronic component; and
a fourth interconnect layer formed on the upper surface of the third insulating layer in the second product area, and electrically connected to the second interconnect layer,
wherein the insulating member and the second insulating layer are made of the same material,
wherein a planar shape of the first conductor layer is larger than a planar shape of the opening,
wherein an annular portion of the second insulating layer is next to the annular groove and on the second conductor layer, and
wherein the insulating member and the annular portion of the second insulating layer have the same height.

2. The laminated structure as claimed in claim 1, wherein a planar shape of the second wall surface matches a planar shape of the first wall surface.

3. The laminated structure as claimed in claim 2, wherein the opening has a planar shape that is rectangular.

4. The laminated structure as claimed in claim 1, wherein the opening has a planar shape that is rectangular.

5. The laminated structure as claimed in claim 1, wherein the electronic component is mounted on the first conductor layer via an adhesive layer in the first product area, and
the insulating member is provided directly on the second conductor layer in the second product area.

6. The laminated structure as claimed in claim 5, wherein the insulating member has a volume that is approximately the same as a volume of a structure formed by the electronic component and the adhesive layer that are laminated.

7. The laminated structure as claimed in claim 6, wherein the insulating member has a planar shape that is approximately the same as a planar shape of the electronic component.

8. The laminated structure as claimed in claim 5, wherein the fourth interconnect layer includes a conductor layer in contact with the insulating member.

9. The laminated structure as claimed in claim 1, wherein the second insulating layer includes
a fourth insulating layer formed on the upper surface of the first insulating layer, and
a fifth insulating layer formed on an upper surface of the fourth insulating layer.

10. The laminated structure as claimed in claim 1, wherein a planar shape of the second conductor layer is larger than a combined planar shape of the annular groove and the annular portion.

* * * * *